US011647637B2

(12) United States Patent
Lin et al.

(10) Patent No.: US 11,647,637 B2
(45) Date of Patent: May 9, 2023

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Meng-Han Lin, Hsinchu (TW); Chia-En Huang, Xinfeng (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/408,023

(22) Filed: Aug. 20, 2021

(65) Prior Publication Data

US 2023/0058806 A1    Feb. 23, 2023

(51) Int. Cl.
*H01L 27/11597*  (2017.01)
*H01L 27/1159*   (2017.01)
*H01L 29/417*    (2006.01)
*H01L 29/24*     (2006.01)
*H01L 27/11585*  (2017.01)
*H01L 27/11587*  (2017.01)

(52) U.S. Cl.
CPC .... *H01L 27/11597* (2013.01); *H01L 27/1159* (2013.01); *H01L 27/11585* (2013.01); *H01L 27/11587* (2013.01); *H01L 29/24* (2013.01); *H01L 29/41741* (2013.01); *H01L 29/41775* (2013.01)

(58) Field of Classification Search
CPC ......... H01L 27/11585; H01L 27/11587; H01L 27/1159; H01L 27/11597; H01L 29/24; H01L 29/41741; H01L 29/41775
See application file for complete search history.

(56) References Cited

U.S. PATENT DOCUMENTS

| | | | |
|---|---|---|---|
| 9,673,304 B1 * | 6/2017 | Sano | H01L 27/2454 |
| 2020/0026990 A1 * | 1/2020 | Lue | G11C 5/025 |
| 2020/0051990 A1 * | 2/2020 | Harari | H01L 27/1214 |
| 2020/0075631 A1 * | 3/2020 | Dong | H01L 29/7827 |
| 2021/0280598 A1 * | 9/2021 | Nagashima | A61B 90/361 |

FOREIGN PATENT DOCUMENTS

| | | | | | |
|---|---|---|---|---|---|
| KR | 20220010027 A | * | 1/2022 | ........ | H01L 27/11551 |
| WO | WO-2020086566 A1 | * | 4/2020 | ......... | H01L 27/0688 |

* cited by examiner

*Primary Examiner* — Matthew E Warren
(74) *Attorney, Agent, or Firm* — Foley & Lardner LLP

(57) ABSTRACT

A semiconductor device comprises a source and a pair of drains disposed on either side of the source in a first direction and spaced apart therefrom. A channel layer extending in the first direction is disposed on at least one radially outer surface of the source and the pair of drains in a second direction perpendicular to the first direction. A memory layer extending in the first direction is disposed on a radially outer surface of the channel layer in the second direction. At least one gate layer that extends in the first direction, is disposed on a radially outer surface of the memory layer in the second direction. A gate extension structure extends from the each of the drains at least part way towards the source in the first direction, and is located proximate to, and in contact with each of the channel layer and the corresponding drain.

20 Claims, 30 Drawing Sheets

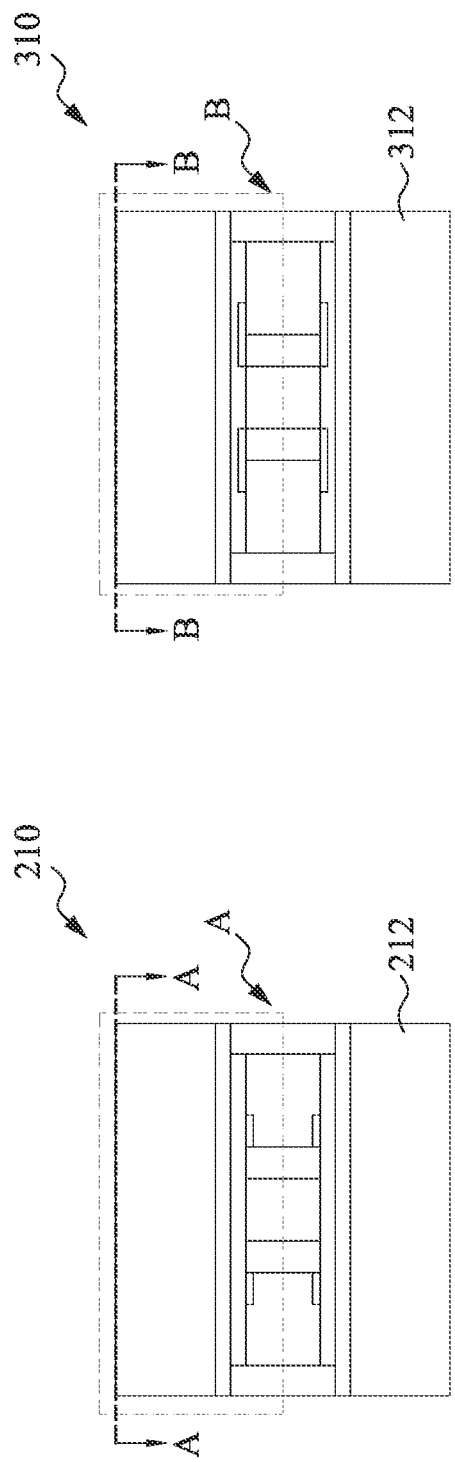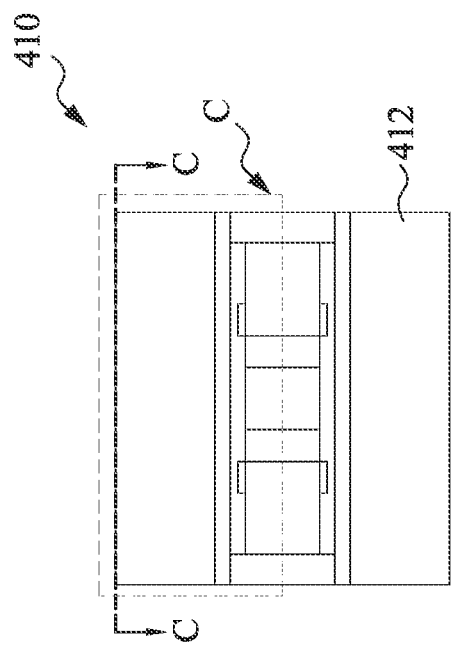

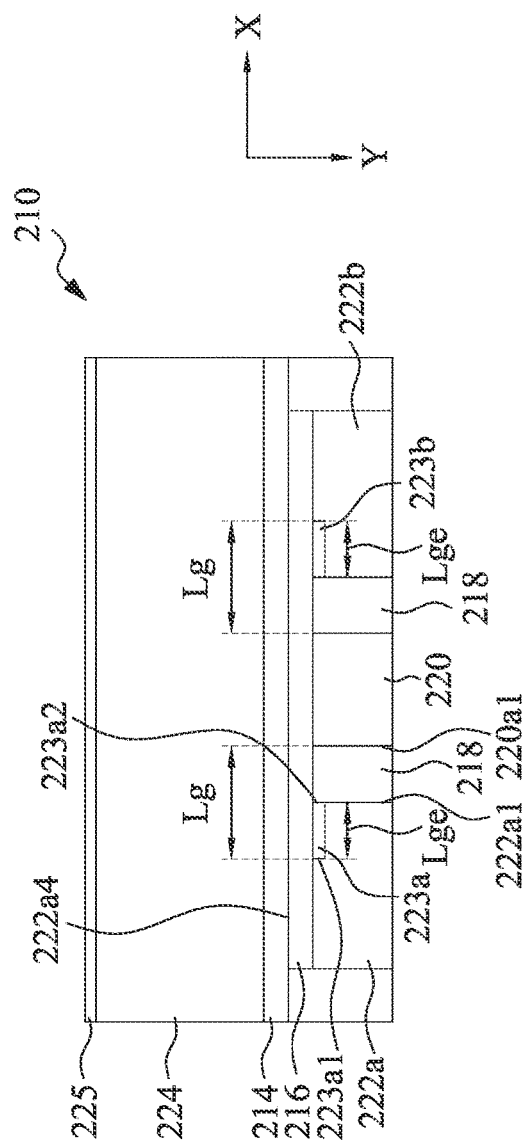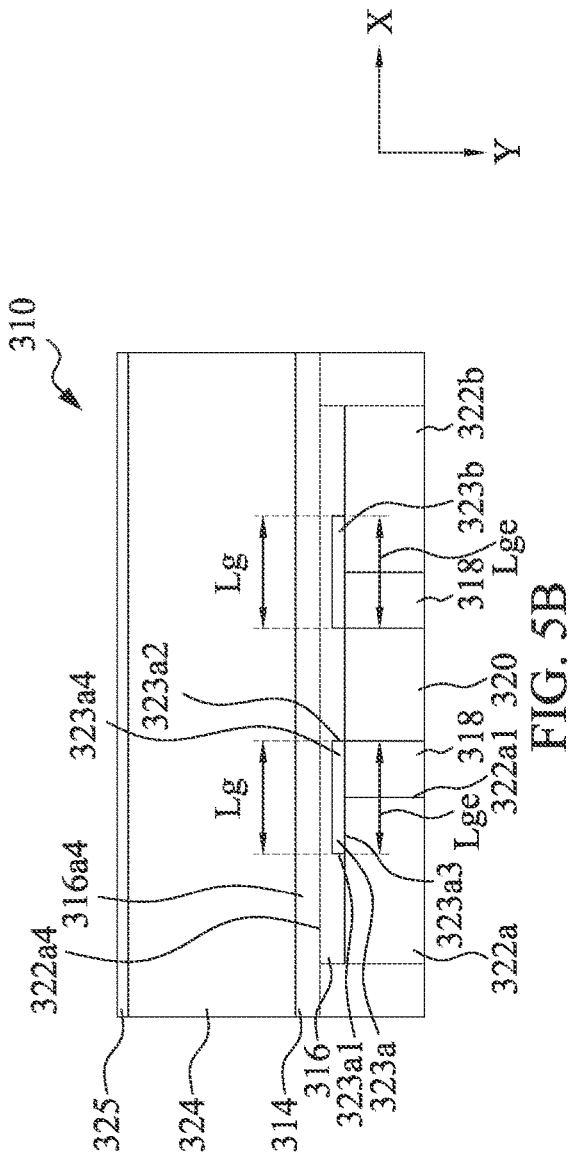

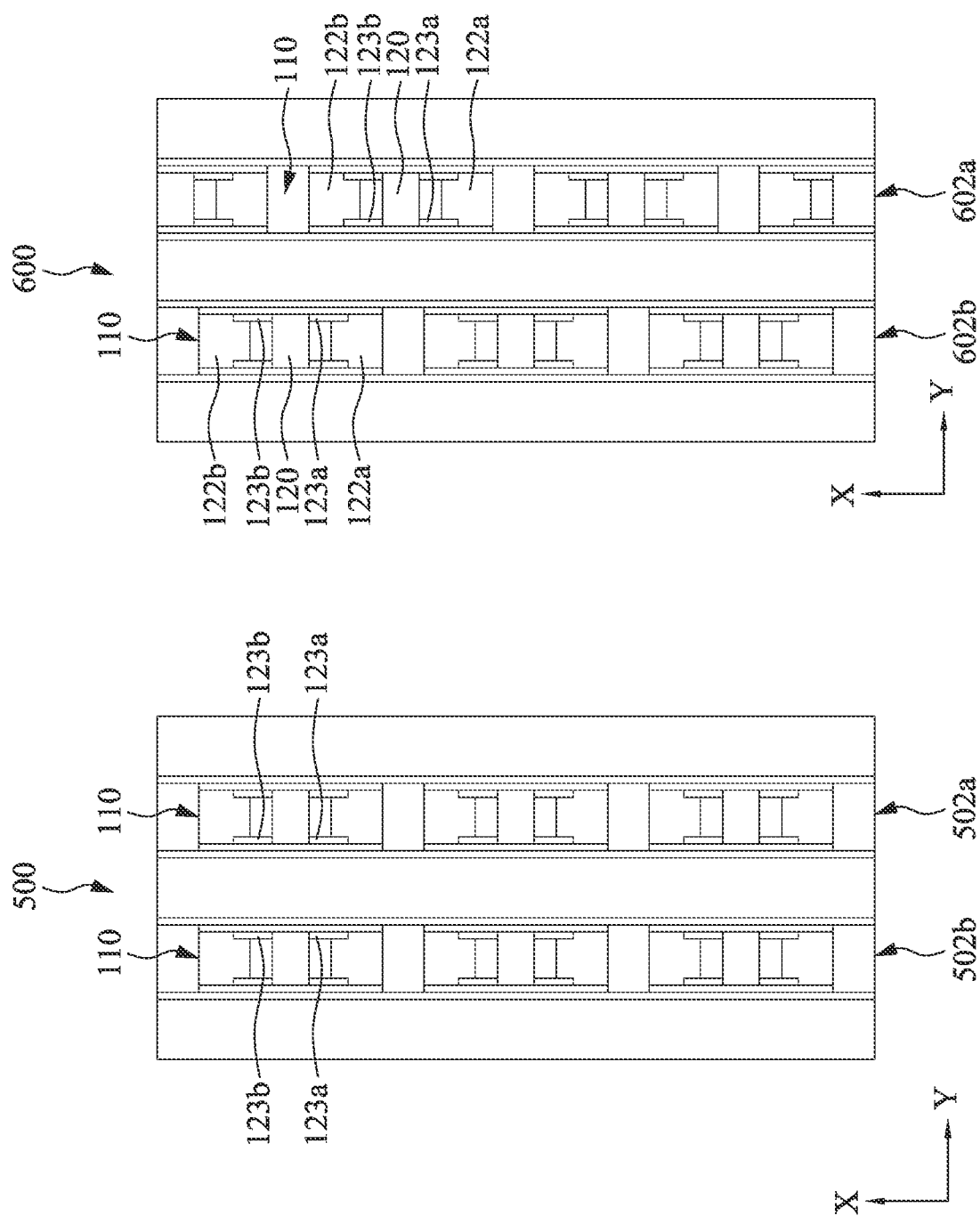

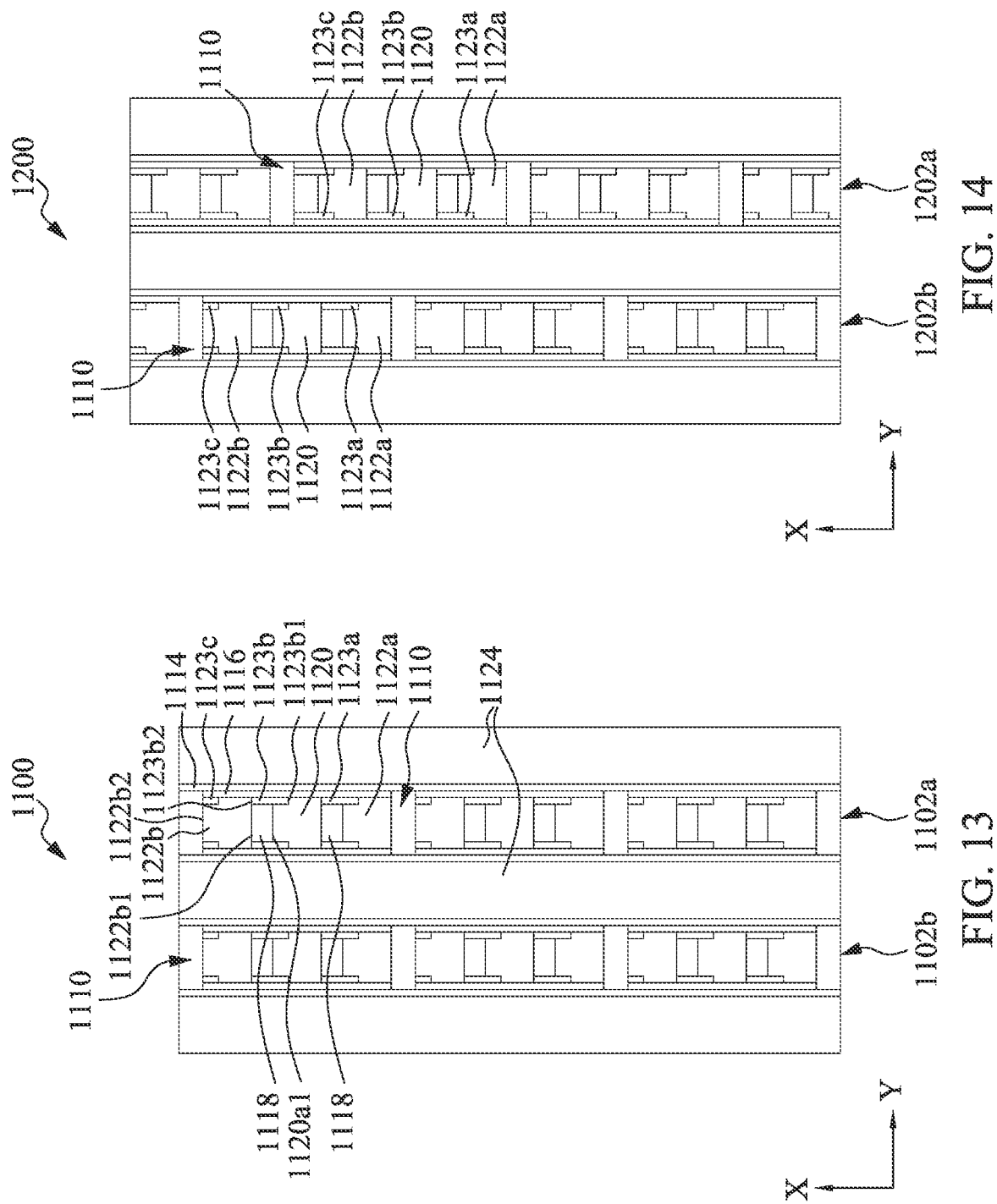

SEMICONDUCTOR MEMORY DEVICES AND METHODS OF MANUFACTURING THEREOF

BACKGROUND

The present disclosure generally relates to semiconductor devices, and particularly to 3-dimensional (3D) memory devices and methods of making such semiconductor devices.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a top view of a semiconductor device, and FIG. 4B is a top-cross-section view of a portion of the semiconductor device indicated by the arrow A in FIG. 4A, and taken along the line A-A in FIG. 4A, according to an embodiment.

FIG. 5A is a top view of a semiconductor device, and FIG. 5B is a top-cross-section view of a portion of the semiconductor device indicated by the arrow B in FIG. 5A, and taken along the line B-B in FIG. 5A, according to another embodiment.

FIG. 6A is a top view of a semiconductor device.

FIGS. 7-14 are top cross-section views of portions of semiconductor dies including a plurality of rows of semiconductor devices, according to various embodiments.

DETAILED DESCRIPTION

Figure 2:
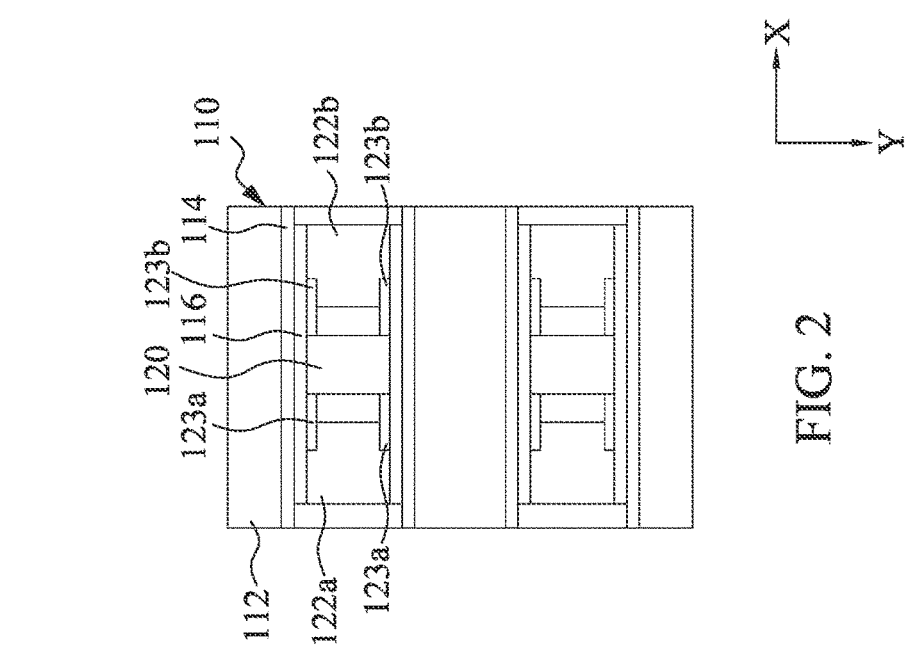
FIG. 2 is a top view of a portion of the semiconductor die of FIG. 1 indicated by the arrow A in FIG. 1.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memories include an array of memory devices formed in a stack of insulating layers and gate layers, and may include a double gate or plurality of gate layers. Such double gate structures can provide a higher etching aspect ratio. During fabrication, the die including an array of semiconductor devices, for example, memory devices is formed. Some memory devices may include a source and a pair of drains disposed in either side of the source and spaced apart from the source. A spacer formed from an insulating material may be disposed between the source and each of the drains. Generally a channel layer extends across radially outer surfaces of the source and drain, and a memory layer is coupled to a radially outer surface of the channel layer, the memory layer coupled to a corresponding gate layer/s. In some instances, when such memory devices are activated by polarizing the gate layer/s, due to the large spacer and distance of drains from the source causes less electric field to flow from the channel layer to the drains to induce polarization switching, which may inhibit switching of memory to erase (ERS) mode from program (PGM) mode. This can cause small memory window (i.e., the voltage range within memory can be stored on the memory device) and lead to reading failure of the memory.

Embodiments of the present disclosure are discussed in the context of forming a semiconductor die, and particularly in the context of forming 3D memory device, that are formed in a stack of insulating layers and gate layers. The 3D memory devices include gate extension structures coupled to each of the drains and the corresponding channel layer, and may extend axially at least part way towards the source. The gate extension structures improve device performance by allowing a higher electric field across the channel layer, and facilitates polarization switching in the channel layer, further resolving read fail issues.

Figure 1:
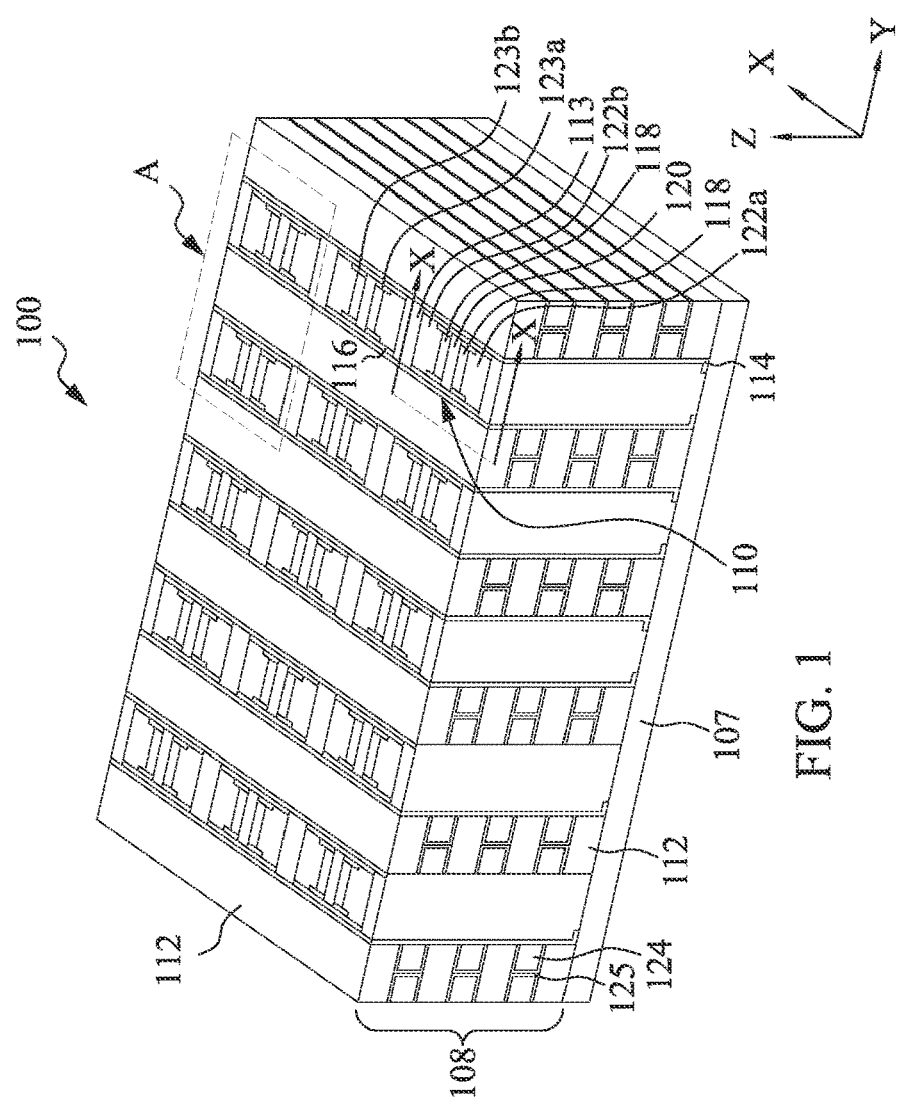
FIG. 1 is a top, perspective view of a semiconductor die including an array of semiconductor devices, each semiconductor device including a source, pair of drains spaced apart from the source, and gate extension structures coupled to a corresponding drain and channel layer of the semiconductor device, according to an embodiment.

FIG. 1 is a top, perspective view of a semiconductor die 100 that includes an array of semiconductor devices 110 (e.g., memory devices), according to an embodiment. The semiconductor die 100 includes a substrate 107 (e.g., a silicon, or silicon on insulator (SOI) substrate, Germanium, silicon oxide, silicon carbide, silicon-germanium, silicon nitride, or any other suitable substrate) on which the plurality of semiconductor devices 110 are disposed. The array of semiconductor devices 110 are arranged in a plurality of rows, each of which extend in a first direction (e.g., the X direction). Each semiconductor device 110 is separated and electrically isolated from an adjacent semiconductor device 110 within a row by a device spacer 113, which may be formed from an electrically insulating material (e.g., silicon oxide ($SiO_2$), silicon nitride (SiN), silicon oxide (SiO), silicon carbide nitride (SiCN), silicon oxycarbonitride (SiOCN), silicon oxynitride (SiON), $HfO_2$, TaOx, TiOx, AlOx, etc.).

Figure 3:
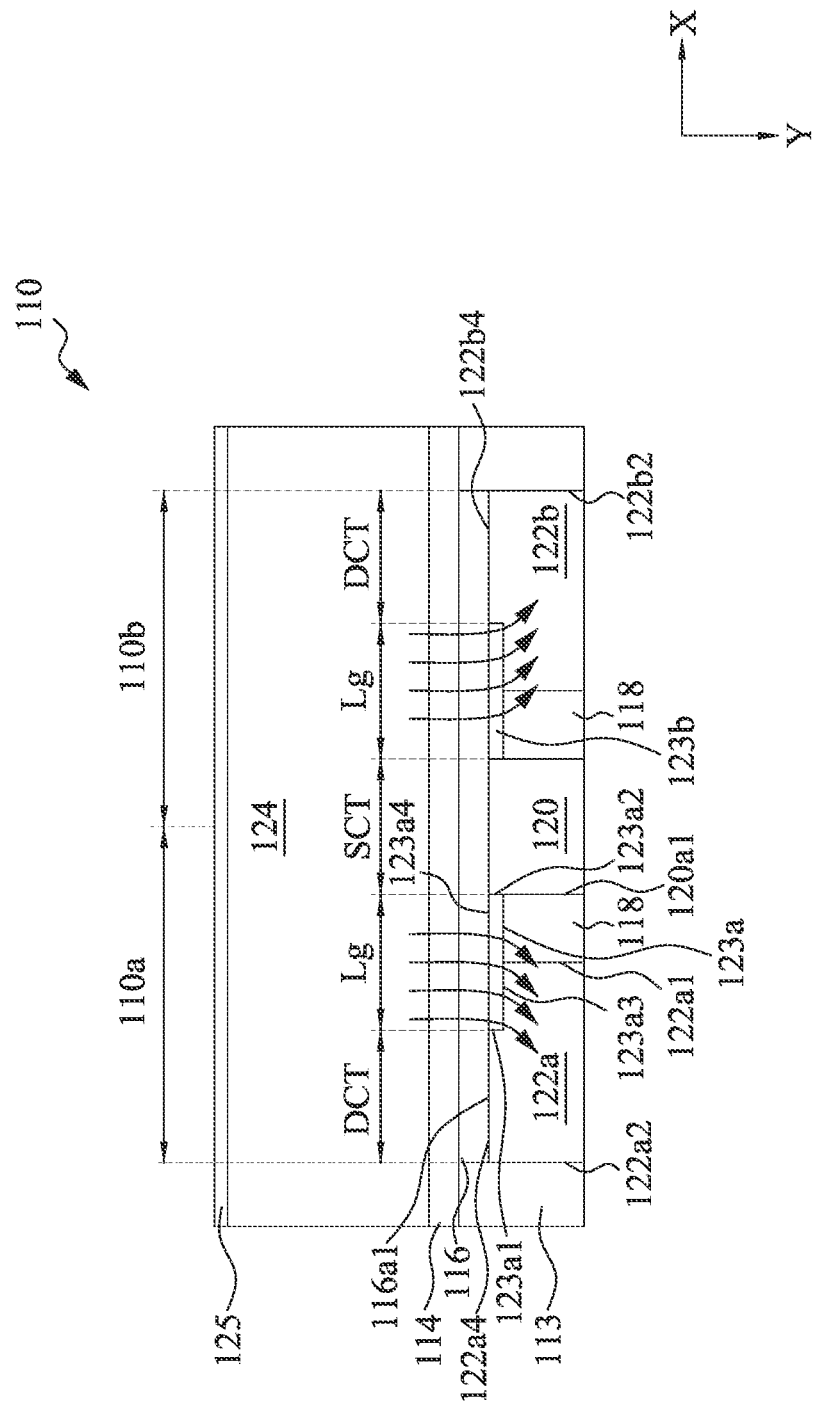
FIG. 3 is a top cross-section view of the semiconductor device of FIG. 1, taken along the line X-X in FIG. 1.

Referring also now to FIGS. 2-3, each semiconductor device 110 includes a source 120 and pair of drains—a first drain 122a and a second drain 122b, disposed on either side of the source 120 in the first direction (e.g., the X-direction) and spaced apart from the source 120. An inner spacer 118 may be disposed between the source 120 and each of the drains 122a/b. In some embodiments, the source 120 and the drains 122a/b may include a conducting material, for example, metals such as Al, Ti, TiN, TaN, Co, Ag, Au, Cu, Ni, Cr, Hf, Ru, W, Pt, WN, Ru, any other suitable material or a combination or alloy thereof. In some embodiments, the source 120 and/or the drains 122a/b may include a semiconductor material, for example, an n or p-doped semiconductor such as Si, SiGe, or any other semiconductor material (e.g., IGZO, ITO, IWO, poly silicon, amorphous Si, etc.), and may be formed using a deposition process, an epitaxial growth process, or any other suitable process. The source 120 and the drains 122a/b extend from a top surface of the semiconductor die 100 to the substrate 107 in a vertical direction (e.g., the Z-direction).

The inner spacer 118 extends between the source 120 and each of the drains 122a/b. The inner spacer 118 may be formed from an electrically insulating material, for example, silicon nitride (SiN), silicon oxide (SiO), $SiO_2$, silicon carbide nitride (SiCN), silicon oxycarbonitride (SiOCN), silicon oxynitride (SiON), $HfO_2$, TaOx, TiOx, AlOx, etc. The inner spacer 118 extends from a top surface of the semiconductor die 100 to the substrate 107 in a vertical direction (e.g., the Z-direction).

A channel layer 116 is disposed on at least one radially outer surface of the source 120 and the pair of drains 122a/b in a second direction (e.g., the Y-direction) perpendicular to the first direction (e.g., the X-direction). The channel layer 116 extends from a top surface of the semiconductor die 100 to the substrate 107 in a vertical direction (e.g., the Z-direction). The channel layer 116 extends in the first direction (e.g., the X-direction) from an axially outward edge of the first drain 122a to an opposite axially outward edge of the second drain 122b. In some embodiments, the channel layer 116 may be formed from a semiconductor material, for example, Si (e.g., polysilicon or amorphous silicon), Ge, SiGe, silicon carbide (SiC), IGZO, ITO, ZnO, IWO, etc. and can be an n-type or p-type doped semiconductor. In the particular embodiment shown in FIGS. 1-3, each semiconductor device 110 includes a pair of channel layers 116. As shown best in FIG. 2, one of the pair of channel layers 116 is disposed on first radially outer surfaces of the source 120 and the drains 122a/b in the second direction (e.g., the Y-direction), and the other of the pair of channel layers 116 is disposed on second radially outer surfaces of the source 120 and drains 122a/b opposite the first radially outer surfaces. In other embodiments, each semiconductor device 110 may include a single channel layer 116 disposed on the first or the second radially outer surfaces of the source 120 and the drains 122a/b.

A memory layer 114 is disposed on a radially outer surface of the channel layer in the second direction (e.g., the Y-direction) and extends in the first direction (e.g., the X-direction). The memory layer extends from a top surface of the semiconductor die 100 to the substrate 107 in a vertical direction (e.g., the Z-direction). In some embodiments, the memory layer 114 may include a ferroelectric material, for example, lead zirconate titanate (PZT), PbZr/ $TiO_3$, $BaTiO_3$, $PbTiO_2$, $HfO_2$, $Hr1-xZ_{rx}O_2$, $ZrO_2$, $TiO_2$, NiO, $TaO_x$, $Cu_2O$, $Nb_2O_5$, $AlO_x$, etc. The memory layer 114 extends in the first direction (e.g., the X-direction) along the axial extent of the semiconductor die 100 in the first direction such that each semiconductor device 110 located in a row of the array of semiconductor devices 110 includes a portion of the memory layer 114, and the memory layer 114 is connected to each of the semiconductor devices 110 included in a corresponding row. As described with respect to the channel layer 116, while FIGS. 1-2 show two memory layers 114, a portion of each of which is included in each of the semiconductor devices 110 included in a row, in other embodiments, each semiconductor device 110 may include a single memory layer.

The semiconductor device 110 may include at least one gate layer disposed on a radially outer surface of the memory layer 114 in the second direction (e.g., the Y-direction), and extending in the first direction (e.g., the X-direction). For example, as shown in FIG. 1, the semiconductor die 100 also includes a stack 108 disposed on an outer surface of the memory layer 114, for example, on outer surfaces of each of the memory layer 114 included in each row of semiconductor device 110, such that the stack 108 is interposed between adjacent rows of semiconductor devices 110. As shown in FIG. 1, the stack 108 includes a plurality of insulating layers 112, and a plurality of gate layers 124 alternatively stacked on top of one another in the vertical direction or the Z-direction. In some embodiments, a topmost layer and a bottommost layer of the stack 108 may include an insulating layer 112 of the plurality of insulating layers 112. The bottommost insulating layer 112 may be disposed on the substrate 107. The insulating layer 112 may include silicon nitride (SiN), silicon oxide (SiO), $SiO_2$, silicon carbide nitride (SiCN), silicon oxycarbonitride (SiOCN), silicon oxynitride (SiON), $HfO_2$, TaOx, TiOx, AlOx, etc. Moreover, the gate layer 124 may be formed from a conductive material such as a metal, for example, aluminum (Al), titanium (Ti), tungsten (W), copper (Cu), cobalt (Co), TiN, tantalum nitride (TaN), silver (Ag), gold (Au), nickel (Ni), chromium (Cr), hafnium (Hf), ruthenium (Ru), platinum (Pt), tungsten nitride (WN), etc., or a high-k dielectric material, for example, hafnium oxide (HfO), tantalum oxide ($TaO_x$), $TiO_x$ etc.

Two parallel gate layers 124 may be located adjacent to each other in a second direction that is perpendicular to the first direction and in the same plane (e.g., the Y-direction), and may be interposed between two vertically separated insulating layers 112. Each gate layer 124 of the two parallel gate layers 124 may be associated with a separate semiconductor devices 110, for example, each associated with a semiconductor device 110 located in rows of the semiconductor devices 110 that are parallel to each other. In some embodiments, an adhesive layer (e.g., the adhesive layer 125 shown in FIG. 1) may be interposed between the gate layer/s 124 and the adjacent insulating layers 112, and facilitate adhesion of the gate layer 124 to the insulating layer 112, and may also serve as a spacer between two parallel gate layers 124 that are interposed between the same vertically separated insulating layers 112. In some embodiments, the adhesion layer (e.g., the adhesion layer 125) may include e.g., titanium (Ti), chromium (Cr), TiN, TaN, WN, or any other suitable adhesive material.

While not shown, driver lines may be coupled to the source 120 and the drains 122a/b of the semiconductor devices 110, and may provide electric charge to the source 120 and the drains 122a/b. In some embodiments, a single driver line may be coupled to a set of sources 120 or a set of drains 122a/b of a plurality of semiconductor devices 110, which are located parallel to each other in the second direction (e.g., the Y-direction).

As previously described, inner spacers 118 that are formed from an insulating material may be disposed between the source 120 and each of the drains 122a/b. When the semiconductor device 110 (e.g., a memory device) is activated by polarizing the gate layers 124, the inner spacer 118 between the source 120 and the drains 122a/b, and distance of drains 122a/b from the source 120 causes less electric field to flow across the channel layer 116 to the drains 122a/b to induce polarization switching, which may inhibit switching of memory to erase (ERS) mode from program (PGM) mode. This can cause small memory window and lead to reading failure of the memory.

Each semiconductor device 110 included in the semiconductor die 100 includes gate extension structures 123a/b extending from each of the drains 122a/b at least part way towards the source 120 in the first direction (e.g., the X-direction), the gate extension structures 123a/b located proximate to the channel layer 116 and being in contact with each of the channel layer 116 and the corresponding drain 122a/b. For example, the gate extension structures 123a/b may be disposed proximate to at least one radially outer edge of each of the pair of drains 122a/b in the second direction (e.g., the Y-direction), and is in contact with the corresponding drain 122a/b and the channel layer 116 disposed proximate to the radial outer edge. The gate extension structures 123a/b may be formed from a dielectric material, for example, SiN, $HfO_2$, $TaO_x$, $TiO_x$, $AlO_x$, etc. The dielectric material may be different from the material that forms the inner spacers 118, and may have a high etch selectivity to the material from which the inner spacers 118 are formed.

For example, referring to FIGS. 2-3, each semiconductor device 110 includes a common source 120 and two drains 122a/b disposed on either side thereof, and spaced apart from the source 120 by inner spacers 118. Each semiconductor device 110 can be considered as comprising two memory cells, a first memory cell 110a extending from the source 120 (e.g., about midpoint of the source 120) to an axially outward edge 122a2 of the first drain 122a, and a second memory cell 110b extending from the source 120 (e.g., about midpoint from the source 120) to an axial outer edge 122b2 of the second drain 122b. In some embodiments, the second memory cell 110b may be a mirror image of the first memory cell 110a as shown in FIG. 3. In other embodiments, the second memory cell 110b may be structurally different from the first memory cell 110a (e.g., have different size of the second drain 122b or the second gate extension structure 123b relative to the first drain 122a and/or the first gate extension structure 123a).

As shown in FIG. 2, a pair of first gate extension structure 123a are associated with the first drain 122a and a pair of second gate extension structures 123b are associated with the second drain 122b. The first and second gate extension structures 123a and 123b may be substantially identical to each other in structure and function. The pair of first gate extension structures 123a are disposed proximate to opposite radially outward edges 122a4 of the first drain 122a and in contact with the first drain 122a and the corresponding portion of the channel layer 116. Similarly, the pair of second gate extension structures 123b are disposed proximate to opposite radially outer edges 122b4 of the second drain 122b and in contact with the second drain 122b and the corresponding portion of the channel layer 116. Each of the first gate extension structures 123a is substantially similar to each of the second gate extension structures 123b. Therefore, while the structure and function of only the first gate extension structure 123a is described, it should be understood that the second gate structure 123b has the same structure and function as the first gate extension structure 123a. However, in other embodiments, the structure of a first gate extension structure may be different from a second gate extension structure.

Referring again to FIG. 3, a first axial end 123a1 of the first gate extension structure 123a is disposed axially outwards of an axially inward edge 122a1 of the first drain 122a that is proximate to the source 120 in the first direction (e.g., the X-direction). A second axial end 123a2 of the first gate extension structure 123a opposite the first axial end 123a1 is in contact with the axial outward edge 120a1 of the source 120 that is proximate to the first drain 122a in the first direction. A first radial edge 123a3 of the first gate extension structure 123a is located radially inwards of a radially outward edge 122a4 of the first drain 122a in the second direction (e.g., the Y-direction), and a second radial edge 123a4 of the first gate extension structure 123a opposite the first radial edge 123a3 is axially aligned with the radially outward edge 122a4 of the first drain 122a in the second direction. In other words, the first axial end 123a1 of the first gate extension structure 123a is bounded by the first drain 122a in the first direction, a first portion and second portion of the first radial edge 123a3 are bounded by the first drain 122a and inner spacer 118, respectively, in the second direction, the second axial end 123a2 is bounded by the source 120, and the second radial edge 123a4 of the first gate extension structure 123a is bounded by the corresponding channel layer 116. It should be noted that the first gate extension structure 123a extends only part way of the axial extent of the first drain 122a in the first direction such that the first axial end 123a1 is located axially inwards of the axially outward edge 122a2 of the first drain 122a.

In semiconductor devices that do not include the gate structure, a gate length $L_g$ is defined by a distance between corresponding edges of the source 120 and each drain 122a/b., i.e., the width of the inner spacer 118. The amount of electric field that passes across the channel layer 116 to the drain to cause polarization switching of the memory layer 114 may depend upon the gate length $L_g$. Because the inner spacer 118 that is formed from an insulating material is disposed between the source 120 and the corresponding drains 122a/b, there is small window proximate to where the drains 122a/b is located proximate to the inner spacer 118 where the electric field flows across the channel layer 116 to the drain 122a/b. The inner spacer 118 inhibits the electric field, which can lead to inhibition of memory state from ERS to PGM due to less electric field across the channel layer 116. One option may be to reduce gate length $L_g$. However, positioning the drains 122a/b too close to the source 120 may cause punch through of charge from the source 120 to the drains 122a/b, or process limitations may limit how close the drains 122a/b may be positionable relative to the source 120.

In contrast, the first gate extension structures 123a of the semiconductor device 110 (and similarly the second gate extension structures 123b) improve the electric field across the channel layer 116 which facilitates polarization switching in the channel layer 116, reducing memory read failure. The first gate extension structures 123a extend the gate length by the portion of the length of the first gate extension structures 123a that extends axially outwards of the axially inward edge 122a1 of the first drain 122a, i.e., extends the gate length $L_g$ to beyond the extent of the inner spacer 118.

In some embodiments, the gate length $L_g$ may be in a range of 5 nm to 500 nm, or any other suitable range. In some embodiments, a length SCT of the source 120 in the first direction, which may define a contact length of the source 120 with the channel layer 116 disposed adjacent thereto may be in a range of 5 nm to 500 nm, inclusive, or any other suitable range. In some embodiments, a source length SCT of the source 120 that corresponds to a contact length of the source 120 with the channel layer 116 may be in a range of 5 nm to 500 nm, inclusive, or any other suitable range. In some embodiments, a drain length DCT of the drains 122a/b that corresponds to a contact length of the drains 122a/b with the channel layer 116 may be in a range of 5 nm to 500 nm, inclusive, or any other suitable range.

In some embodiments, DCT>SCT. In other embodiments, DCT=SCT. In still other embodiments, DCT<SCT. The relative ration of the DCT to the SCT may be based on contact resistance of the source 120 and drains 122a/b to the channel layer 116 material, and fabrication process limitations. In some embodiments, gate length $L_g$>(DCT or SCT). In other embodiments, gate length $L_g$=(DCT or SCT). In still other embodiments, $L_g$<(DCT or SCT). In some embodiments, a ratio of a thickness of the gate extension structures 123a/b to a thickness of the channel layers 116 may be in a range of about 5% to about 90%, inclusive, or any other suitable range.

As shown in FIGS. 1-3, a length of the gate extension structures 123a/b is equal to the gate length $L_g$ such that the gate extension structures 123a/b extend from the drains 122a/b to corresponding axial outer edges of the source 120. In other embodiments, a gate extension structure may have a smaller length then the gate length $L_g$. For example, FIG. 4B is a top cross-section view of a portion of a semiconductor device 210 indicated by the arrow A in FIG. 4A, taken along the line A-A shown in FIG. 4A according to an embodiment. The cross-section is taken such that a top insulating layer 212 of the semiconductor device 210 is removed. The semiconductor device 210 includes a source 220 and drains 222a/b spaced apart from the source 220 in a first direction (e.g., the X-direction), with inner spacers 218 disposed therebetween. The semiconductor device 210 also includes a channel layer 216, a memory layer 214, at least one gate layer 224, and in some embodiments, an adhesion layer 225 coupled to the at least one gate layer 224.

The semiconductor device 210 also includes gate extension structures 223a/b disposed proximate to a radially outward edge 222a4 of each of the pair of drains 222a/b in a second direction that is perpendicular to the first direction (e.g., the Y-direction), and being in contact with the corresponding drain 222a/b and the channel layer 216 disposed proximate to the radial outward edge 222a4. The semiconductor device 210 is substantially similar to the semiconductor device 110. However, different from the semiconductor device 110, a first axial end 223a1 of the first gate extension structure 223a is disposed axially inwards of an axially inward edge 222a1 of the corresponding first drain 222a that is proximate to the source 220 in the first direction, and a second axial end 223a2 of the first gate extension structure 223a opposite the first axial end 223a1 is axially aligned with the axially inward edge 222a1 of the first drain 222a. The second gate extension structure 223b has the same structure as the first gate extension structure 223a. In such embodiments, length $L_ge$ of the gate extension structures 223a/b is smaller than the gate length Lg. While the second axial end 223a2 of the first gate extension structure 223a is shown as being axially aligned with the axially inward edge 222a1 of the first drain, in some embodiments, first gate extension structure 223a may extend part way towards an axially outward edge 220a1 of the source 220 such that the second axial end 223a2 is located axially inward of the axially inward edge 222a1 of the first drain 222a.

In some embodiments, a gate extension structure may be disposed substantially within the channel layer. For example, FIG. 5B is a top cross-section view of a semiconductor device 310 indicated by the arrow B in FIG. 5A, taken along the line B-B shown in FIG. 5A, according to an embodiment. The cross-section is taken such that a top insulating layer 312 of the semiconductor device 310 is removed. The semiconductor device 310 includes a source 320 and drains 322a/b spaced apart from the source 320 in a first direction (e.g., the X-direction), with inner spacers 318 disposed therebetween. The semiconductor device 310 also includes a channel layer 316, a memory layer 314, at least one gate layer 324, and in some embodiments, an adhesion layer 325 coupled to the at least one gate layer 324.

The semiconductor device 310 also includes gate extension structures 323a/b disposed proximate to a radially outward edge 322a4 of each of the pair of drains 322a/b in a second direction (e.g., the Y-direction), that is perpendicular to the first direction and being in contact with the corresponding drain 322a/b and the channel layer 316 disposed proximate to the radial outward edge 322a4. The semiconductor device 310 is similar to the semiconductor device 110. However, different from the device 110, a first radial edge 323a3 of the first gate extension structure 323a is axially aligned with a radially outward edge 3224 of the first drain 322a in the second direction (e.g., the Y-direction) and a second radial edge 323a4 of the first gate extension structure 323a opposite the first radial edge 323a3 is located radially outward of the radially outward edge 322a4 of the corresponding first drain 322a in the second direction. Moreover, the first radial edge 323a3 of the first gate extension structure 323a is axially aligned with a corresponding radially inward edge 316a1 of the channel layer 316 in the second direction, and the second radial edge 323a4 of the first gate extension structure 323a is disposed radially outward of the corresponding radially inward edge 316a4 of the channel layer 316 in the second direction such that the first gate extension structure 323a is bounded on three sides by the channel layer 316 (i.e., the first and second axial ends 323a1 and 323a2, and the second radial edge 323a4), and one side (i.e., the first radial edge 323a3) partially by the first drain 322a and partially by the inner spacer 318. Furthermore, a length $L_ge$ of the gate extension structures 323a/b is equal to a gate length $L_g$.

Figure 6B:
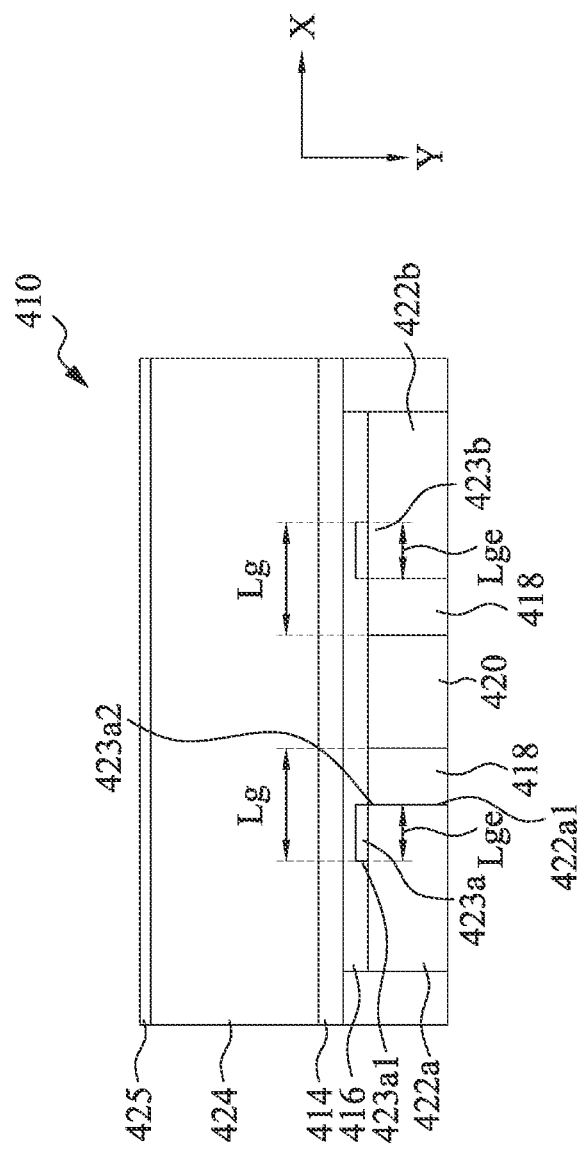
FIG. 6B is a top-cross-section view of a portion of the semiconductor device indicated by the arrow C in FIG. 6A, and taken along the line C-C in FIG. 6A, according to still another embodiment.

FIG. 6B is a top cross-section view of a semiconductor device 410 indicated by the arrow C in FIG. 6A, taken along the line C-C shown in FIG. 6A, according to another embodiment. The cross-section is taken such that a top insulating layer 412 of the semiconductor device 410 is removed. The semiconductor device 410 includes a source 420 and drains 422a/b spaced apart from the source 420 in a first direction (e.g., the X-direction), with inner spacers 418 disposed therebetween. The semiconductor device 410 also includes a channel layer 416, a memory layer 414, at least one gate layer 424, and in some embodiments, an adhesion layer 425 coupled to the at least one gate layer 424.

The semiconductor device 410 is substantially similar to the semiconductor device 310, with the only difference being that each of the first and second gate extension structures 423a and 423b have a length $L_{ge}$ that is smaller than a gate length $L_g$. More specifically, a first axial end 423a1 of the first gate extension structure 423a extends axially inwards of an axially inward edge 422a1 of the first drain 422a, and the opposite second axial end 423a2 is axially aligned with the axially inward edge 422a1 of the first drain 422a.

Each semiconductor die can include any number of semiconductor devices that may be arranged in rows and in any suitable configuration. For example, FIG. 7 is a top cross-section view of a portion of a semiconductor die 500, according to an embodiment. The semiconductor die 500 includes a first row 502a and second row 502b of semiconductor devices 110, which are parallel to each other. Each of the semiconductor devices 110 disposed in the first row 502a of the semiconductor die 100 is parallel to and axially aligned in a first direction (e.g., the X-direction) with another semiconductor device 110 disposed in the second row 502b that is parallel to the first row 502a in the second direction (e.g., the Y-direction). This causes first and second gate extension structures 123a/b of each of the semiconductor device 110 included in the first row 502a to be axially aligned with corresponding first and second gate extension structures 123a/b of corresponding semiconductor devices 110 included in the second row 502b.

FIG. 8 is a top cross-section view of a portion of a semiconductor die 600, according to another embodiment. The semiconductor die 600 includes a first row 602a and second row 602b of semiconductor devices 110, which are parallel to each other. Each of the semiconductor devices 110 disposed in the first row 602a of the semiconductor die 100 is parallel to and axially offset (e.g., by at least about half of an axial length of the semiconductor device 110 in the second direction, or any other suitable offset distance) in a first direction (e.g., the X-direction) with another semiconductor device 110 disposed in the second row 602b that is parallel to the first row 602a in the second direction (e.g., the Y-direction). This causes first and second gate extension structures 123a/b of each of the semiconductor device 110 included in the first row 502a to be axially offset with corresponding first and second gate extension structures 123a/b of corresponding semiconductor devices 110 included in the second row 502b (e.g., by at least about half of an axial length of the semiconductor device 110 in the second direction, or any other suitable offset distance). Offsetting may reduce fabrication complexity by creating more space when communication lines or leads are coupled or routed to the source 120 and drains 122a/b of the semiconductor devices 710a/b.

Figure 9:
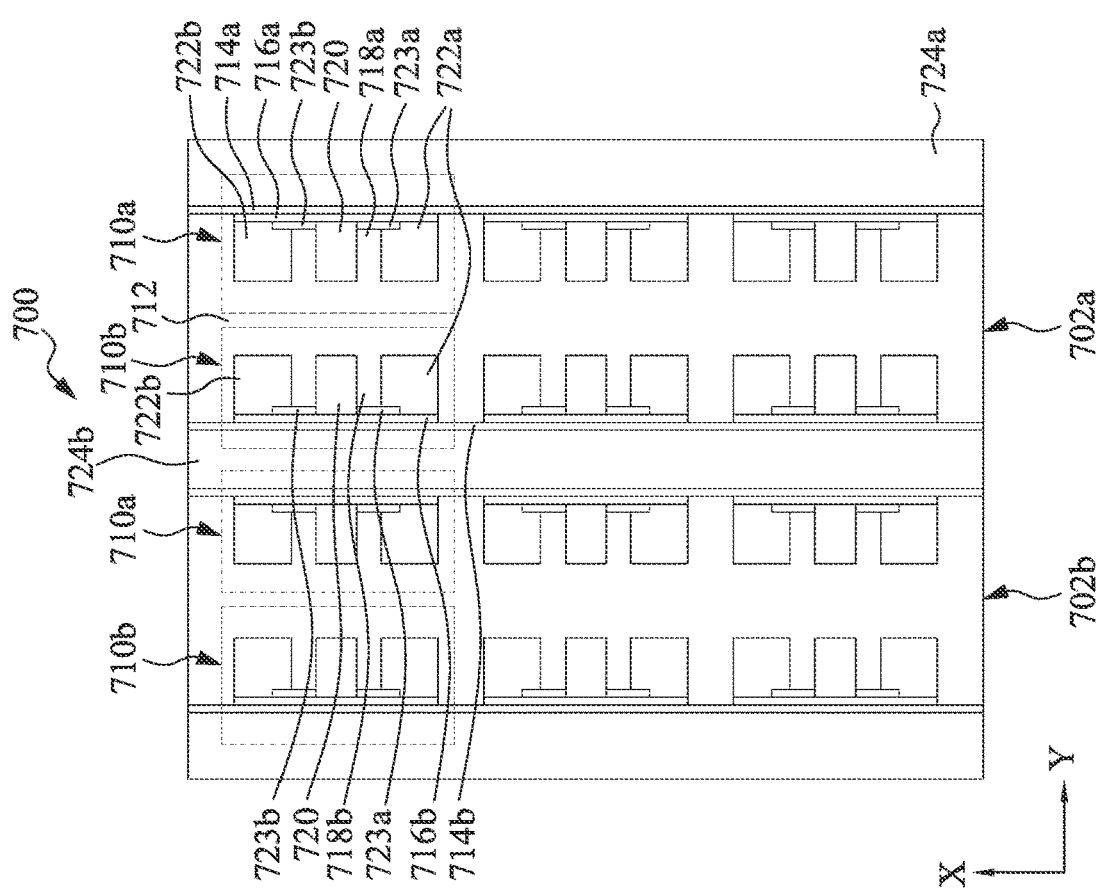

In some embodiments, a semiconductor device may include a single channel layer, and a single gate extension layer. For example, FIG. 9 is a top cross-section view of a semiconductor die 700, according to another embodiment. The semiconductor die 700 includes a first row 702a and a second row 702b, each row 702a and 702b including a first set of semiconductor devices 710a and a second set of semiconductor devices 710b. Each of the first set of semiconductor devices 710a are disposed in a first sub-row within the first row 702a, and the second set of semiconductor devices 710b are disposed in a second sub-row within the first row 702a. Similarly, the second row 702b also includes a first sub-row of the first set of semiconductor devices 710a and the second sub-row of the second set of semiconductor devices 710b. Each of the first set of semiconductor devices 710a include a source 720, a pair of drains 722a/b spaced apart from the source 720 by first inner spacers 718a, and gate extension structures 723a/b associated with the drains 722a/b, respectively. Each of the first set of semiconductor devices 710a also include a single first channel layer 716a disposed on first radially outer surfaces of the source 720 and the drains 722a/b, as well as the gate extension structures 723a/b in the second direction (e.g., the Y-direction). A single first memory layer 714a is disposed on a radially outer surface of the first channel layer 716a, the first memory layer 714a being continuous among all the first set of semiconductor devices 710a included in the first sub-row. At least one first gate layer 724 is disposed on radially outer surfaces of the memory layer 714. An insulating layer 712 is disposed on radially inner surfaces of the source 720 and drains 722a/b such that the second set of semiconductor devices 710b within the first row 702a are separated from the first set of semiconductor devices 710a by the insulating layer 712.

The second set of semiconductor devices 710b are a mirror image of first set of semiconductor devices 710a, and also include the source 720, the pair of drains 722a/b spaced apart from the source 720 by inner spacers 718b, gate extension structures 723a/b associated with the drains 722a/b, respectively, a single second channel layer 716b, a single second memory layer 714b, and at least one second gate layer 724b. The insulating layer 712 is disposed on radially inner surfaces of the source 720 and drains 722a/b, as described with respect to the first set of semiconductor devices 710a.

Each of the first and second set of semiconductor devices 710a/b disposed in the first row 702a of the semiconductor die 700 is parallel to and axially aligned in the first direction (e.g., the X-direction) with a first and second set of semiconductor devices 710a/b disposed in the second row 702b that is parallel to the first row 702a in the second direction (e.g., the Y-direction). This causes first and second gate extension structures 723a/b of each of the semiconductor device 710a/b included in the first row 702a to be axially aligned with corresponding first and second gate extension structures 723a/b of corresponding semiconductor devices 710a/b included in the first row 702a as well as the second row 702b.

Figure 10:
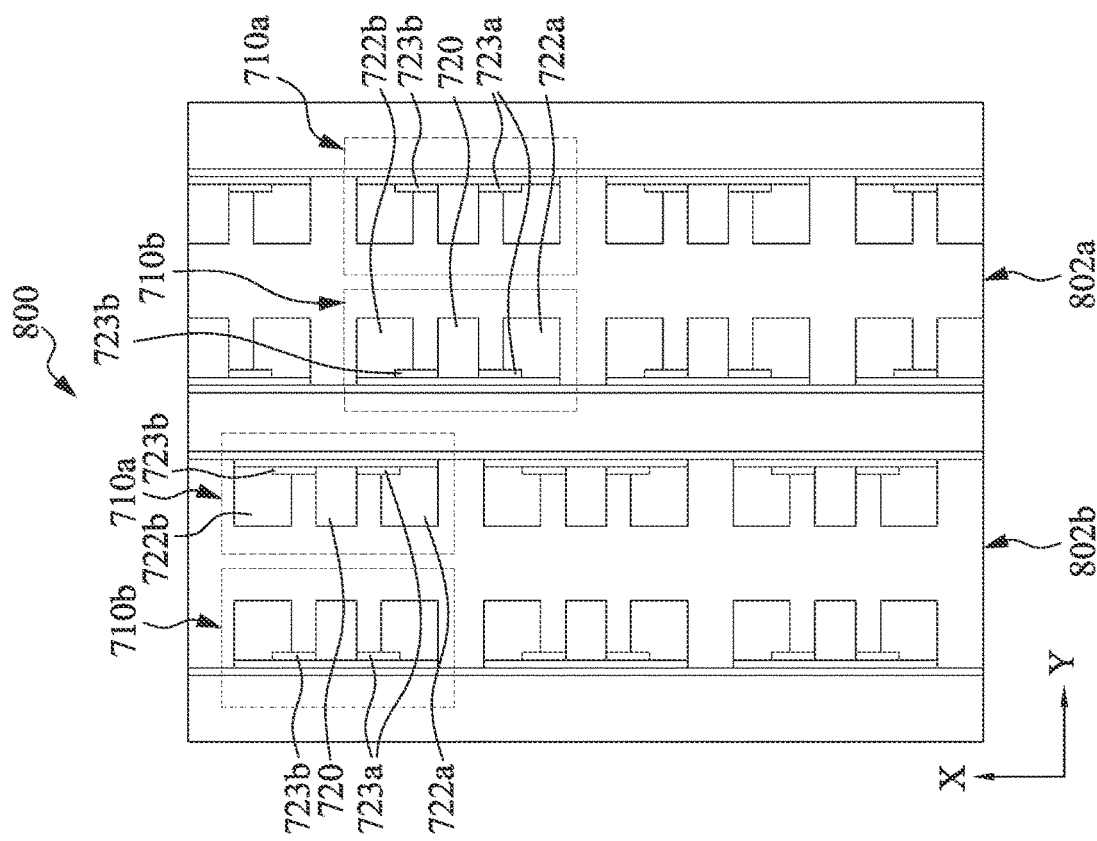

FIG. 10 is top cross-section view of a semiconductor die 800 according to another embodiment. The semiconductor die 800 is substantially similar to the semiconductor die 700 and includes a first row 802a including the first and second set of semiconductor devices 710a/b, and a second row 802b disposed parallel to the first row 802a in the second direction, and also including the first and second set of semiconductor devices 710a/b. However, each of the first and second set of semiconductor devices 710a/b disposed in the first row 802a of the semiconductor die 800 are parallel to and axially offset in the first direction with the first and second set of semiconductor device 710a/b disposed in the second row 802b that is parallel to the first row 802a in the second direction. This causes first and second gate extension structures 723a/b of each of the first set of semiconductor device 710a located within the first or second row 802a/b to be axially aligned with a corresponding one of the second set of semiconductor devices 710b located in the same first or second row 802a/b, but first and second gate extension structures 723a/b of each of the first set of semiconductor device 710a semiconductor devices 710a/b located in the first row to be axially offset (e.g., by at least about half of an axial length of the semiconductor device 710a/b in the second direction, or any other suitable offset distance) with corresponding first and second gate extension structures 723*a/b* of corresponding semiconductor devices 710*a/b* included in the second row 802*b*. Offsetting may reduce fabrication complexity by creating more space when communication lines or leads are coupled or routed to the source 720 and drains 722*a/b* of the semiconductor devices 710*a/b*.

Figure 11:
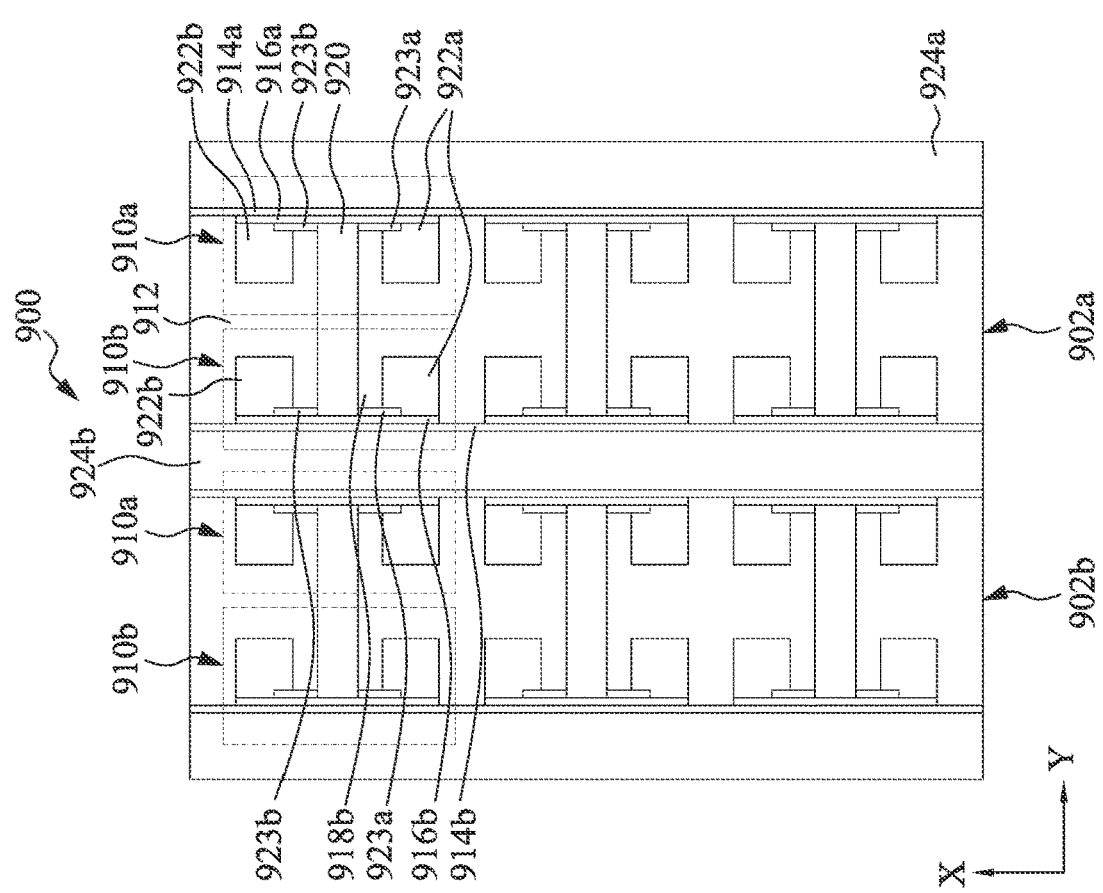

FIG. 11 is a top cross-section view of a semiconductor die 900, according to another embodiment. The semiconductor die 900 includes a first row 902*a* and a second row 902*b* extending in a first direction (e.g., the X-direction), each row 902*a* and 902*b* including a first set of semiconductor devices 910*a* and a second set of semiconductor devices 910*b* disposed parallel to each other in a second direction perpendicular to the first direction (e.g., the Y-direction). Each of the first set of semiconductor devices 910*a* is disposed in a first sub-row within the first row 902*a* and the second set of semiconductor devices 910*b* are disposed in a second sub-row within the first row 902*a*. Similarly, the second row 902*b* also includes a first sub-row of the first set of semiconductor devices 910*a* and the second sub-row of the second set of semiconductor devices 910*b*. Each of the first set of semiconductor devices 910*a* include a source 920, a pair of drains 922*a/b* spaced apart from the source 920 by first inner spacers 918*a*, and gate extension structures 923*a/b* associated with the drains 922*a/b*, respectively. Each of the first set of semiconductor devices 910*a* also include a single first channel layer 916*a* disposed first radially outer surfaces of the source 920 and the drains 922*a/b*, as well as the gate extension structures 723*a/b* in the second direction (e.g., the Y-direction). A first memory layer 914*a* is disposed on a radially outer surface of the first channel layer 916*a*, the first memory layer 914*a* being continuous among all the first semiconductor devices 910*a* included in the first sub-row. At least one first gate layer 924 is disposed on radially outer surfaces of the memory layer 914. The second set of semiconductor devices 910*b* are a mirror image of first set of semiconductor devices 910*a*, and also include the source 920, the pair of drains 922*a/b* spaced apart from the source 920 by inner spacers 918*b*, gate extension structures 923*a/b* associated with the drains 922*a/b*, respectively, a single second channel layer 916*b*, a single second memory layer 914*b*, and at least one second gate layer 924*b*. The drains 922*a/b* of the second set of semiconductor devices 910*b* are spaced part from drains of the corresponding first semiconductor device 910*a* included in the first set. An insulating layer 912 is disposed on radially inner surfaces of the drains 922*a/b* such that the drains of the second set of semiconductor devices 910*b* within the first row 902*a* are separated from the drains of the first set of semiconductor devices 710*a* by the insulating layer 912. However, different from the semiconductor die 700, the source 920 extends from the first channel layer 916*a* to the second channel layer 916*b* in the second direction such that the source 920 is included in each of the corresponding first and second semiconductor devices 910*a/b* included in the first and second set, respectively (i.e., each source 920 is shared between one of the first set of semiconductor devices 910*a*, and a corresponding one of the second set of semiconductor devices 910*b*).

Each of the first and second set semiconductor devices 910*a/b* disposed in the first row 902*a* of the semiconductor die 900 is parallel to and axially aligned in the first direction (e.g., the X-direction) with a first and second set of semiconductor devices 910*a/b* disposed in the second row 902*b* that is parallel to the first row 902*a* in the second direction (e.g., the Y-direction). This causes first and second gate extension structures 923*a/b* of each of the semiconductor device 910*a/b* included in the first row 902*a* to be axially aligned with corresponding first and second gate extension structures 923*a/b* of corresponding semiconductor devices 910*a/b* included in the first row 902*a* as well as the second row 902*b*.

Figure 12:
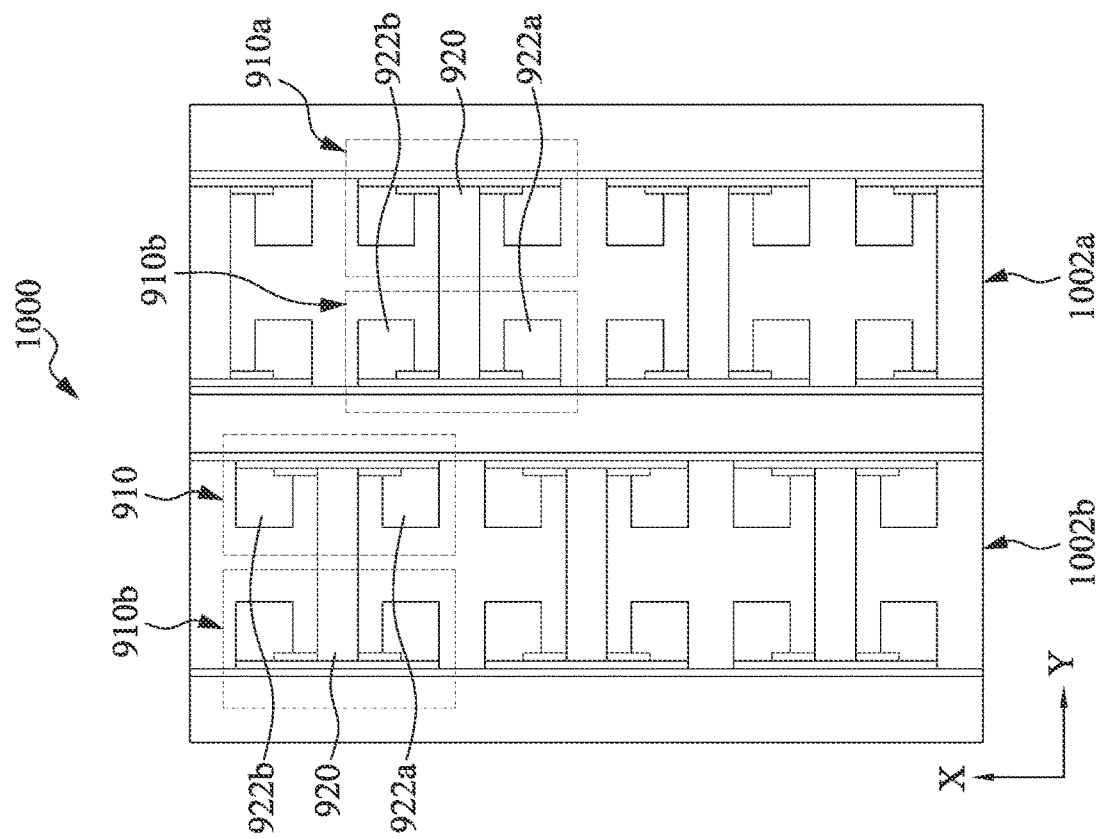

FIG. 12 is top cross-section view of a semiconductor die 1000 according to another embodiment. The semiconductor die 1000 is substantially similar to the semiconductor die 900 and includes a first row 1002*a* including the first and second set of semiconductor devices 910*a/b*, and a second row 1002*b* disposed parallel to the first row 1002*a* in the second direction, and also including the first and second set of semiconductor devices 910*a/b*. However, each of the first and second set of semiconductor devices 910*a/b* disposed in the first row 1002*a* of the semiconductor die 1000 are parallel to and axially offset in the first direction with the first and second semiconductor device 910*a/b* disposed in the second row 1002*b* that is parallel to the first row 1002*a* in the second direction. This causes first and second gate extension structures 902*a/b* of each of the first set of semiconductor device 902*a* located within the first or second row 1002*a/b* to be axially aligned with a corresponding one of the second set of semiconductor devices 902*b* located in the same first or second row 1002*a/b*, but first and second gate extension structures 923*a/b* of each of the first set of semiconductor device 910*a* semiconductor devices 902*a/b* located in the first row 1002*a* to be axially offset (e.g., by at least about half of an axial length of the semiconductor device 902*a/b* in the second direction, or any other suitable offset distance) with corresponding first and second gate extension structures 923*a/b* of corresponding semiconductor devices 910*a/b* included in the second row 1002*b*. Offsetting may reduce fabrication complexity by creating more space when communication lines or leads are coupled or routed to the source and drain of the semiconductor devices 910*a/b*.

FIG. 13 is a top cross-section view of a semiconductor die 1100, according to another embodiment. The semiconductor die 1100 includes a first row 1102*a* and second row 1102*b* of semiconductor devices 1110, which are parallel to each other. The semiconductor device 1110 includes a source 1120 and drains 1122*a/b* spaced apart from the source 1120 in a first direction (e.g., the X-direction), with inner spacers 1118 disposed therebetween. The semiconductor device 1110 also includes a channel layer 1116, a memory layer 1114, and at least one gate layer 1124. The first drain 1122*a* includes first gate extension structures 1123*a*, which are substantially similar to the first gate extension structure 123*a* described with respect to the semiconductor device 110.

Different from the semiconductor device 110, the semiconductor device 1110 includes a second gate extension structure 1123*b* in contact with the second drain 1122*b* opposite the first drain 1122*a*. A first axial end 1123*b*1 of the second gate extension structure 1123*b* is in contact with an axially inward edge 1122*b*1 of the second drain 1122, and a second axial end 1123*b*2 of the second gate extension structure 1123*b* opposite the first axial end 1123*b*1 is disposed radially inward of an axially outward edge 1120*a*1 of the source 1120 that is proximate to the second drain 1122*b* in the first direction (e.g., the X-direction). Thus the second drain 1122*b* extends axially inwards into the source 1120, may serve to facilitate charge transfer from the source across the channel layer 116. In some embodiments, the semiconductor device 1110 may also include a third gate extension structure 1123*c* coupled to the second drain 1122*b*. The third gate extension structure 1123*c* extends from an axially outer edge 1122*b*2 of the second drain 1122*b* part way towards the axially inward edge 1122*b*1 of the second drain 1122*b*.

Each of the semiconductor devices 1110 disposed in the first row 1102*a* of the semiconductor die 1100 is parallel to and axially aligned in a first direction (e.g., the X-direction) with another semiconductor device 1110 disposed in the second row 1102b that is parallel to the first row 1102a in the second direction (e.g., the Y-direction). This causes first, second, and third gate extension structures 1123a/b/c of each of the semiconductor device 1110 included in the first row 1102a to be axially aligned with corresponding first, second, and third gate extension structures 1123a/b/c of corresponding semiconductor devices 1110a/b included in the second row 1102b.

FIG. 14 is a top cross-section view of a portion of a semiconductor die 1200, according to another embodiment. The semiconductor die 1200 includes a first row 1202a and second row 1202b of the semiconductor devices 1110, which are parallel to each other. Each of the semiconductor devices 1110 disposed in the first row 1102a of the semiconductor die 1100 is parallel to and axially offset in a first direction (e.g., the X-direction) with another semiconductor device 1110 disposed in the second row 1102b that is parallel to the first row 1102a in the second direction (e.g., the Y-direction). This causes first, second, and third gate extension structures 1123a/b/c of each of the semiconductor device 1110 included in the first row 1102a to be axially offset with corresponding first, second, and third gate extension structures 1123a/b/c of corresponding semiconductor devices 1110 included in the second row 1102b (e.g., by at least about half of an axial length of the semiconductor device 1110 in the second direction, or any other suitable offset distance). Offsetting may reduce fabrication complexity by creating more space when communication lines or leads are coupled or routed to the source 1120 and drains 1122a/b of the semiconductor devices 1110a/b.

Figure 15A:
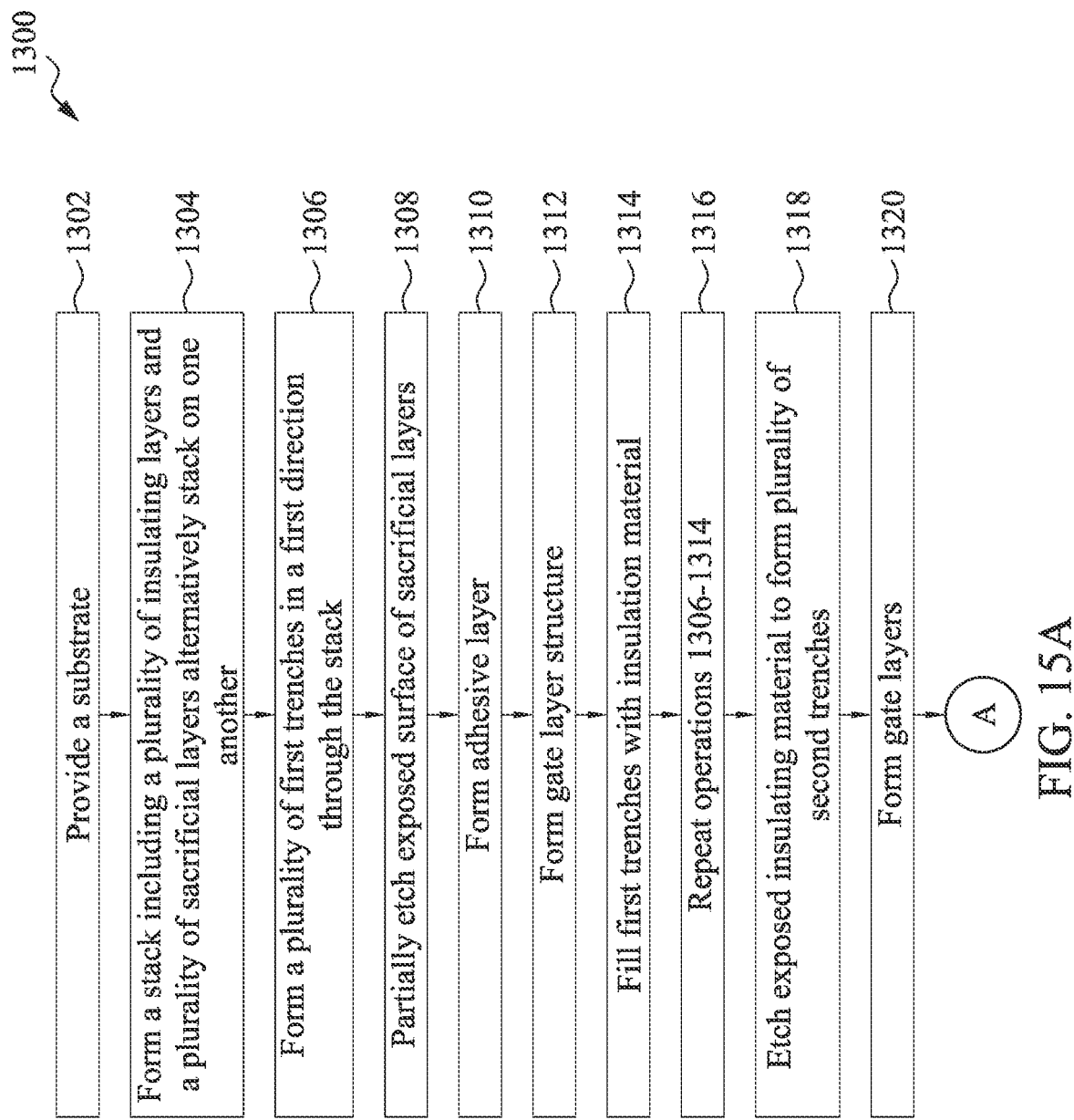
FIGS. 15A-15C are schematic flow charts of a method for forming a semiconductor die, according to an embodiment.
Figure 15B:
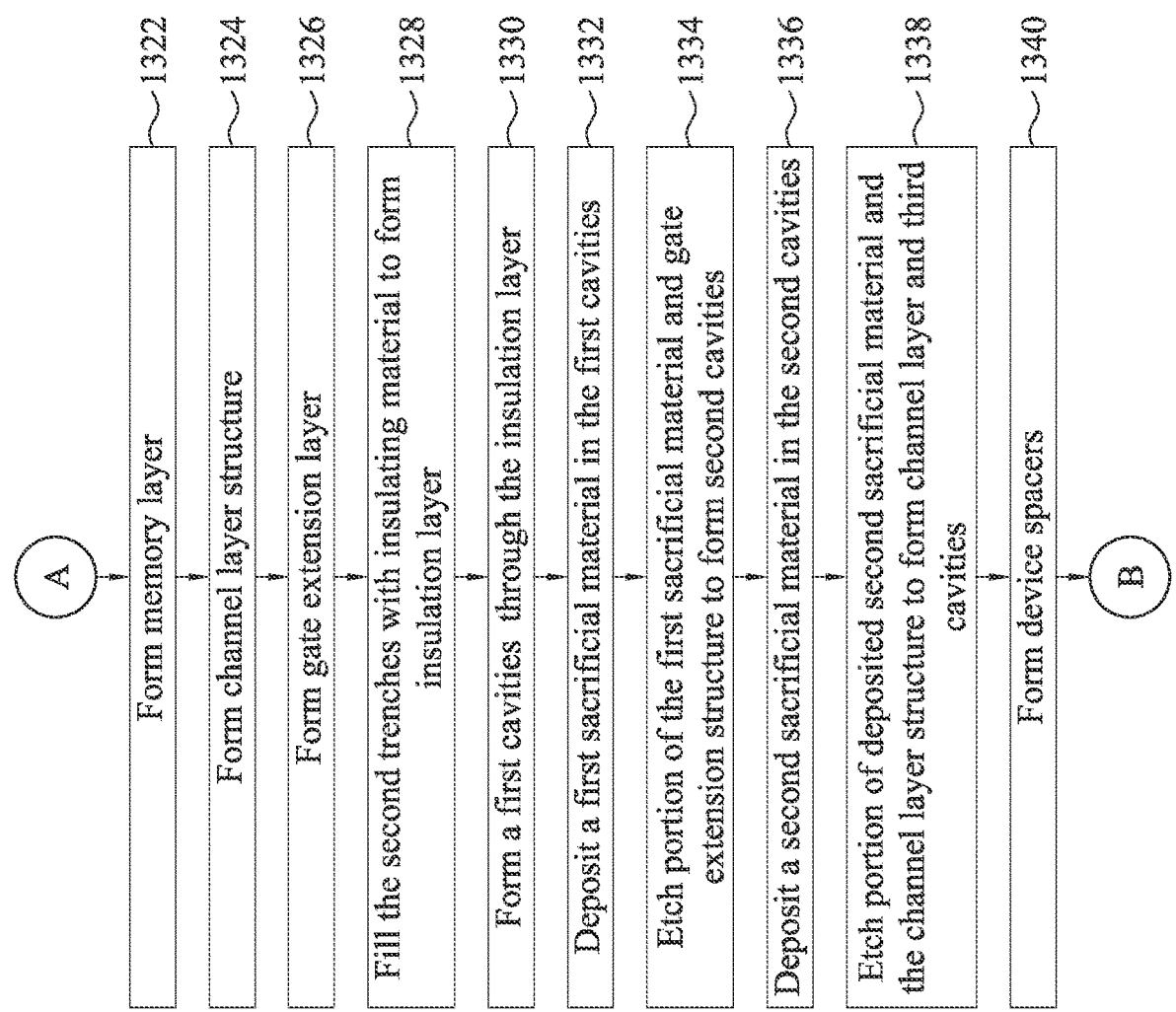
Figure 15C:
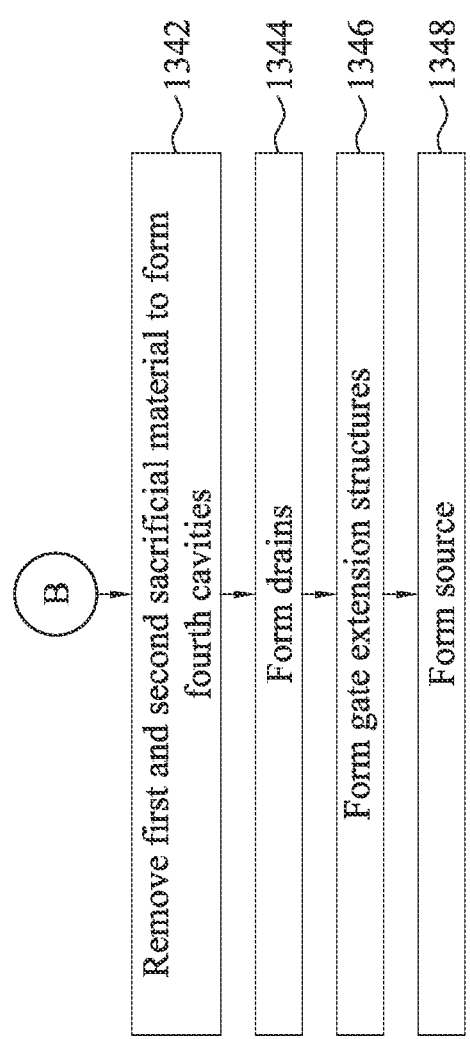

FIGS. 15A-15C illustrate a flowchart of a method 1300 for forming a semiconductor die 1400, for example, a die including a plurality of 3D memory devices (e.g., any of the semiconductor devices described with respect to FIGS. 1-14), according to an embodiment. For example, at least some of the operations (or steps) of the method 1300 may be used to form a 3D memory device (e.g., the semiconductor device 110), a nanosheet transistor, a nanowire transistor device, a vertical transistor device, or the like. It should be noted that the method 1300 is merely an example, and is not intended to limit the present disclosure. Accordingly, it is understood that additional operations may be provided before, during, and after the method 1300 of FIGS. 15A-15C, and that some other operations may only be described briefly described herein. In some embodiments, operations of the method 1300 may be associated with perspective views of the example semiconductor die 1400 at various fabrication stages as shown in FIGS. 16, 17, 18, 19, 20, 21, 22, 23, 24A, 24B, 25A, 25B, 26A, 26B, 27A, 27B, 28A, 28B, 29A, 29B, 30A, 30B, 31A, 31B, 32A, 32B, 33A, and 33B, and in some embodiments are represented with respect to the semiconductor die 1400 that represents a 3D memory device, the operations are equally applicable to any other semiconductor device, for example, the semiconductor dies 200, 300, 400, 500, 600, 700, 800, 900, 1000, 1100, or 1200 shown in FIGS. 4-14 or any other semiconductor die (e.g., a GAA FET device, a nanosheet transistor device, a nanowire transistor device, a vertical transistor device, etc.). Although FIGS. 16-33B illustrate the semiconductor die 1400 including the plurality of semiconductor devices 110, it is understood that the semiconductor die 1400 may include a number of other devices such as inductors, fuses, capacitors, coils, etc., which are not shown in FIGS. 16-33B, for purposes of clarity of illustration.

The method 1300 may generally include providing a stack comprising a plurality of insulating layers and a plurality of sacrificial layers alternatively stacked on top of each other, the stack extending in a first direction (e.g., the X-direction). One of the insulating layers may form a bottom layer, and another of the insulating layers may form a top layer of the stack. The method 1300 may also include forming a plurality of gate layers by replacing the plurality of sacrificial layers. The method 1300 may also include forming a memory layer extending along the first direction radially inwards of and coupled to the plurality of gate layers in a second direction perpendicular to the first direction (e.g., the Y-direction). The method 1300 also includes forming a channel layer extending along the first direction and coupled to a radially inner surface of the memory layer in the second direction. The method 1300 also includes forming gate extension structures extending along portions of the channel layer in the first direction, and coupled to radially inner surfaces of the channel layer in the second direction. The method 1300 also included forming a source and a pair of drains disposed on either side of the source, and spaced apart from the source (e.g., by an inner spacer), in the first direction. A portion of a radially outer surface of at least the drains being in contact with a corresponding gate extension structure in the second direction.

Figure 16:
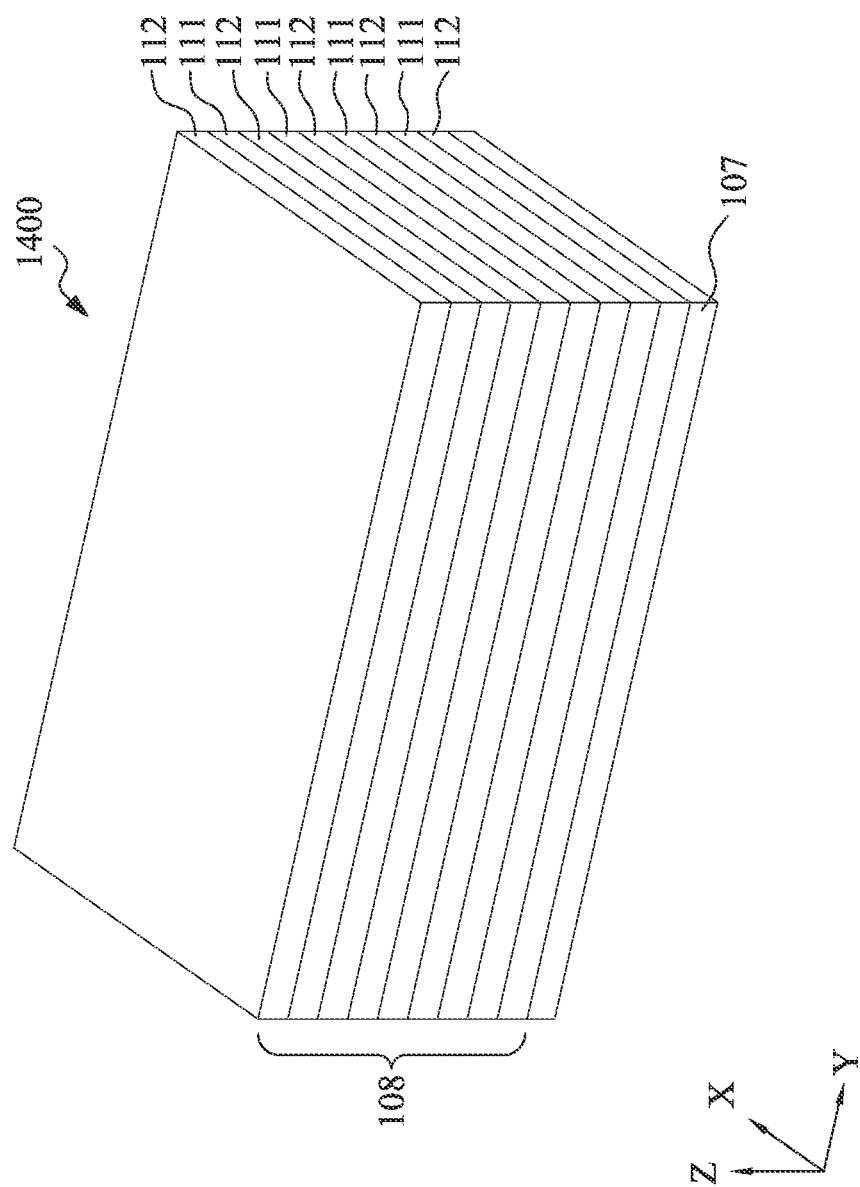
FIGS. 16, 17, 18, 19, 20, 21, 22, 23, 24A, 24B, 25A, 25B, 26A, 26B, 27A, 27B, 28A, 28B, 29A, 29B, 30A, 30B, 31A, 31B, 32A, 32B, 33A, and 33B illustrate various views of an example semiconductor die (or a portion of the example semiconductor die) during various fabrication stages, made by the method of FIGS. 15A-15C, in accordance with some embodiments.

Expanding further the method 1300 starts with operation 1302 that includes providing a substrate, for example, the substrate 107 shown in FIGS. 1 and 16. The substrate 107 may be a semiconductor substrate, such as a bulk semiconductor, a semiconductor-on-insulator (SOI) substrate, or the like, which may be doped (e.g., with a p-type or an n-type dopant) or undoped. The substrate 107 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, any other suitable semiconductor material, or combinations thereof.

At 1304, a stack (e.g., the stack 108 shown in FIG. 16) is formed on the substrate. The stack includes a plurality of insulating layers (e.g., the insulating layers 112) and a plurality of sacrificial layers (e.g., the sacrificial layers 111 shown in FIG. 16) alternately stacked on top of each other in the vertical direction (e.g., the Z-direction). Corresponding to operations 1302-1304, FIG. 16 is a top, perspective view of the stack 108 disposed on the substrate 107. The insulating layers 112 and the sacrificial layers 111 are alternately disposed on top of one another in the Z-direction. For example, one of the sacrificial layers 111 is disposed over one of the insulating layers 112, then another one of the insulating layers 112 is disposed on the sacrificial layer 111, so on and so forth. As shown in FIG. 16, a topmost layer (e.g., a layer distal most from the substrate 107) and a bottommost layer (e.g., a layer most proximate to the substrate 107) of the stack 108 may include an insulating layer 112. While FIG. 16 shows the stack 108 as including 5 insulating layers 112 and 4 sacrificial layers, the stack 108 may include any number of insulating layers 112 and sacrificial layers 111 (e.g., 4, 5, 6, 7, 8, or even more). In various embodiments, if the number of sacrificial layers 111 in the stack 108 is n, a number of insulating layers 112 in the stack 108 may be n+1.

Each of the plurality of insulating layers 112 may have about the same thickness, for example, in a range of about 5 nm to about 100 nm, inclusive, or any other suitable thickness. Moreover, the sacrificial layers 111 may have the same thickness or different thickness from the insulating layers 112. The thickness of the sacrificial layers 111 may range from a few nanometers to few tens of nanometers (e.g., in a range of 5 nm to 100 nm, inclusive, or any other suitable thickness).

The insulating layers 112 and the sacrificial layers 111 have different compositions. In various embodiments, the insulating layers 112 and the sacrificial layers 111 have compositions that provide for different oxidation rates and/or different etch selectivity between the respective layers. In some embodiments, the insulating layers 112 may be formed from SiO, and the sacrificial layers 111 may be formed from SiN. In various embodiments, the insulating layers 112 may be formed from any suitable first material (e.g., an insulating material) as described with respect to the semiconductor device 110, and the sacrificial layers 111 may be formed from a second material (e.g., also an insulating material) that is different from the first material. In some embodiments, the sacrificial layers may include SiN, $HfO_2$, $TaO_x$, $TiO_x$, $AlO_x$, or any other material that has a high etch selectivity relative to the insulating layers 112 (e.g., an etch selectivity ratio of at least 1:100, or any other suitable etch selectivity ratio). The sacrificial layers 111 are merely spacer layers that are eventually removed and do not form an active component of the semiconductor die 1400.

In various embodiments, the insulating layers 112 and/or the sacrificial layers 111 may be epitaxially grown from the substrate 107. For example, each of the insulating layers 112 and the sacrificial layers 111 may be grown by a molecular beam epitaxy (MBE) process, a chemical vapor deposition (CVD) process such as a metal organic CVD (MOCVD) process, a furnace CVD process, and/or other suitable epitaxial growth processes. During the epitaxial growth, the crystal structure of the substrate 107 extends upwardly, resulting in the insulating layers 112 and the sacrificial layers 111 having the same crystal orientation as the substrate 107. In other embodiments, the insulating layers 112 and the sacrificial layers 111 may be grown using an atomic layer deposition (ALD) process.

Figure 17:
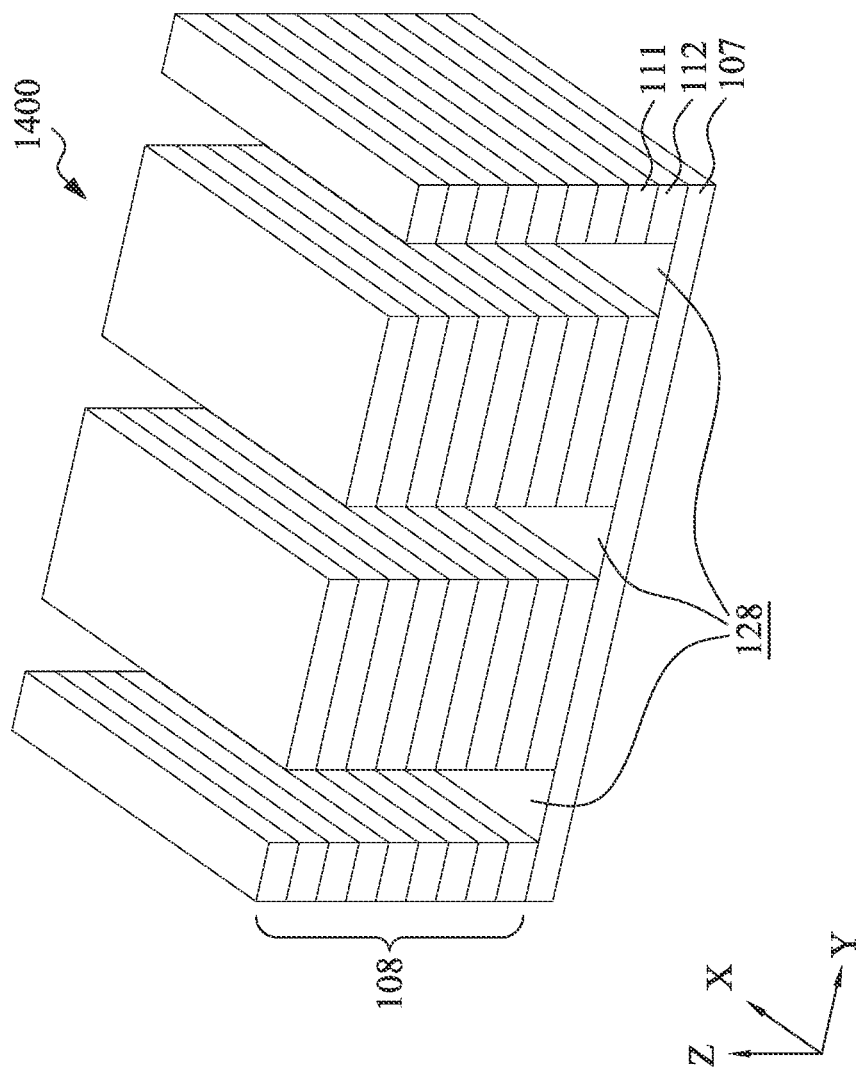

At 1306, a plurality of first trenches are formed through the stack in the first direction (e.g., the X-direction), the trenches extending from the topmost insulating layer to the substrate. Corresponding to operation 1306, FIG. 17 is a top, perspective view of the semiconductor die 1400 after a plurality of first trenches 128 extending in the X-direction have been formed through the stack 108 up to the substrate 107 by etching the stack 108 in the Z-direction. The etching process for forming the plurality of trenches 128 may include a plasma etching process, which can have a certain amount of anisotropic characteristic. For example, the trenches 128 may be formed, for example, by depositing a photoresist or other masking layer on a top surface of the semiconductor die 1400, i.e., the top surface of the topmost insulating layer 112 of the stack 108, and a pattern corresponding to the first trenches 128 defined in the masking layer (e.g., via photolithography, e-beam lithography, or any other suitable lithographic process). In other embodiments, a hard mask may be used.

Subsequently, the stack 108 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first trenches 128. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 17, the etch used to form the plurality of trenches 128 etches through each of the sacrificial layers 111 and insulating layers 112 of the stack 108 such that each of the plurality of trenches 128 extend from the topmost insulating layer 112 through the bottommost insulating layer 112 to the substrate 107.

Figure 18:
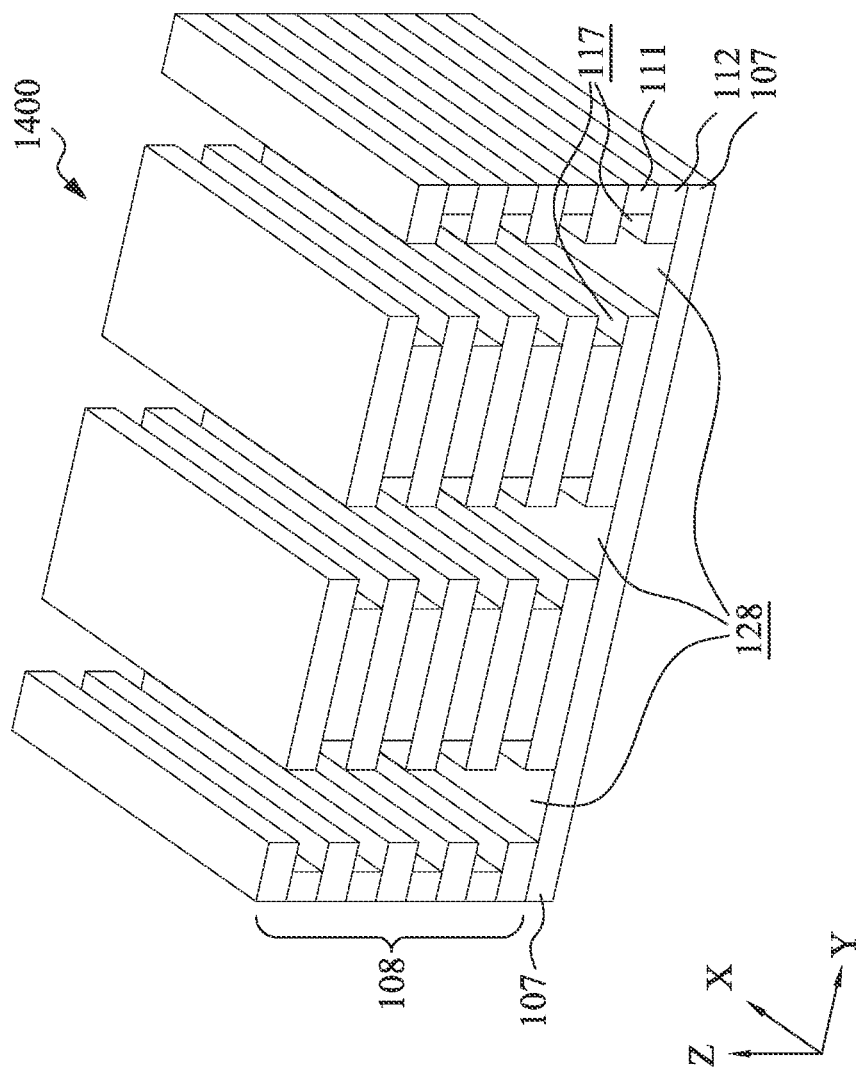

At operation 1308, exposed surfaces of the sacrificial layers within the trenches are partially etched so as to reduce a width of the sacrificial layers relative to the insulating layers in the stack. Corresponding to operation 1308, FIG. 18 is a top, perspective view of the semiconductor die 1400 after partially etching exposed surfaces of the sacrificial layers 111 that are located in the trenches 128. For example, the exposed surfaces extend in the X-direction and etching the exposed surfaces of the sacrificial layers 111 reduces a width of the insulating layers 112 on either side of the sacrificial layers 111 in the Y-direction. In some embodiments, the sacrificial layers 111 may be etched using a wet etch process (e.g., hydrofluoric etch, buffered hydrofluoric acid, phosphoric acid, etc.). In other embodiments, the exposed surfaces of the sacrificial layers 111 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers in the Y-direction reduces a width of the sacrificial layers 111 relative to the insulating layers 112 disposed in the stack 108 such that cavities 117 are formed whose boundaries are formed by top and bottom surfaces of adjacent insulating layers 112 and a surface of the partially etched sacrificial layers 111 that face the first trenches 128 and extend in the X-direction.

Figure 19:
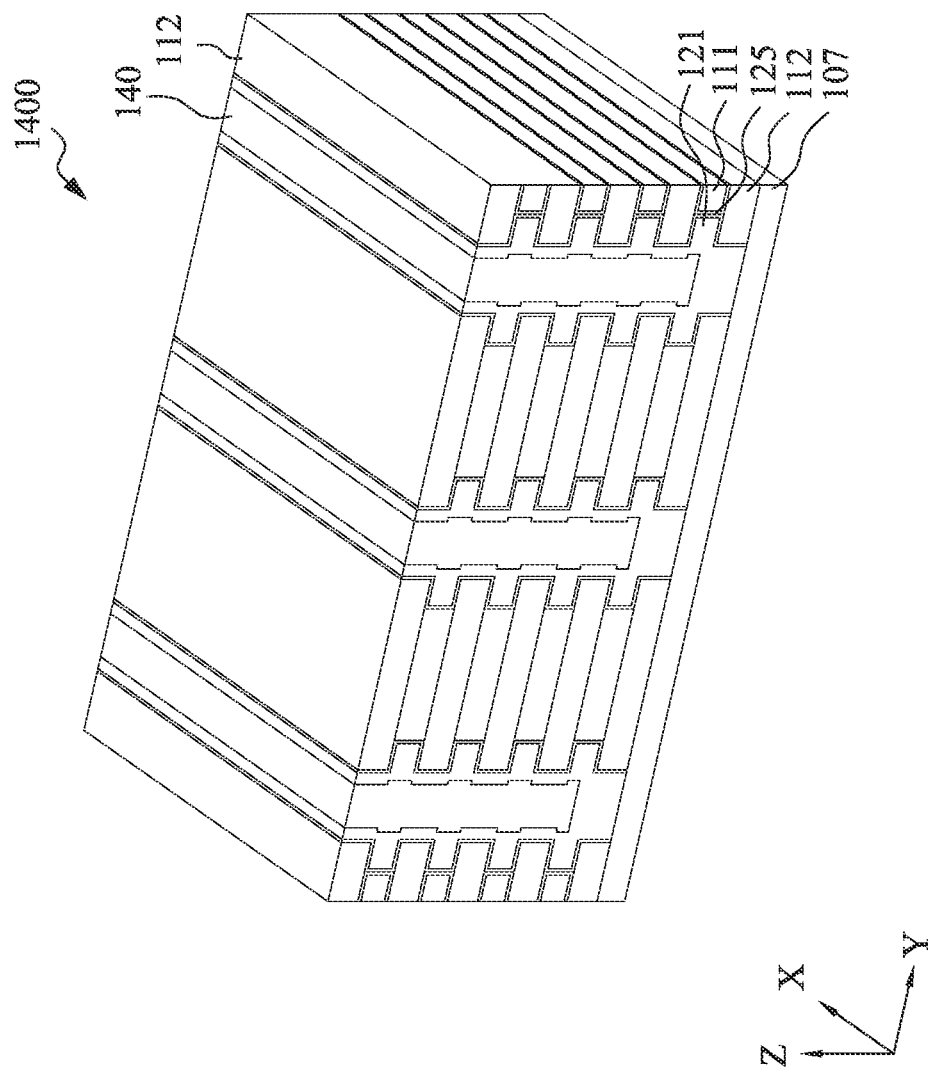

At operation 1310, an adhesive layer is formed on exposed portions of sidewalls of the first cavities, the sidewalls of the insulating layer that form a sidewall of the first trenches, on a top surface of the substrate that forms a base of the first trenches. At operation 1312, a gate layer structure is formed on exposed surfaces of the adhesive layer. At operation 1314, the first trenches are filled with an insulating material. Corresponding to operation 1310-1314, FIG. 19 is a top, perspective view of the semiconductor die 1400 after filling the first trenches 128 with the insulating material 140. In various embodiments, the adhesive layers 125 may include a material that has good adhesion with each of the insulating layers 112, the sacrificial layers 111, and the gate layer structure 121, for example, Ti, Cr, TiN, WN, etc. The adhesive layers 125 may be deposited using any suitable method including, for example, molecular beam deposition (MBD), atomic layer deposition (ALD), CVD, PECVD, MOCVD, epitaxial growth, and the like. In some embodiments, the adhesive layer 125 may have a thickness in a range of 0.1 nm to 5 nm, inclusive, or any other suitable thickness.

In various embodiments, the gate layer structure 121 is formed by depositing a gate dielectric and/or gate metal in the cavities 117 over the adhesive layer 125, such that the gate layer structure 121 is a continuous along the walls of each of the first trenches 128, and on the top surface of the substrate 107. In various embodiments, the gate layer structure 121 may be formed from a high-k dielectric material. Although, each of gate layer structures 121 shown in FIG. 19 is shown as a single layer, in other embodiments, the gate layer structures 121 can be formed as a multi-layer stack (e.g., including a gate dielectric layer and a gate metal layer), while remaining within the scope of the present disclosure. The gate layer structures 121 may be formed of different high-k dielectric materials or a similar high-k dielectric material. Example high-k dielectric materials include a metal oxide or a silicate of Hf, Al, Zr, La, Mg, Ba, Ti, Pb, and combinations thereof (e.g., Al, Ti, TiN, TaN, Co, Ag, Au, Cu, Ni, Cr, Hf, Ru, W, Pt, WN, Ru, etc.). The gate layer structure 121 can be deposited using any suitable method, including, for example, molecular beam deposition (MBD), atomic layer deposition (ALD), CVD, PECVD, MOCVD, epitaxial growth, and the like.

In some embodiments, the gate layer structure 121 may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process. In some embodiments, a chemical mechanical planarization (CMP) operation may be performed after filling the first trenches 128 to planarize the top surface of the semiconductor die 1400.

The insulating material 140 may be deposited using any suitable method, for example, molecular beam deposition (MBD), atomic layer deposition (ALD), CVD, PECVD, MOCVD, epitaxial growth, and the like. The insulating material 140 may include $SiO_2$, $SiON$, $SiN$, $SiCN$, $HfO_2$, $TaO_x$, $TiO_x$, $AlO_x$, etc. In some embodiments, the insulating material 140 may be same as the material of the insulating layers 112.

Figure 20:
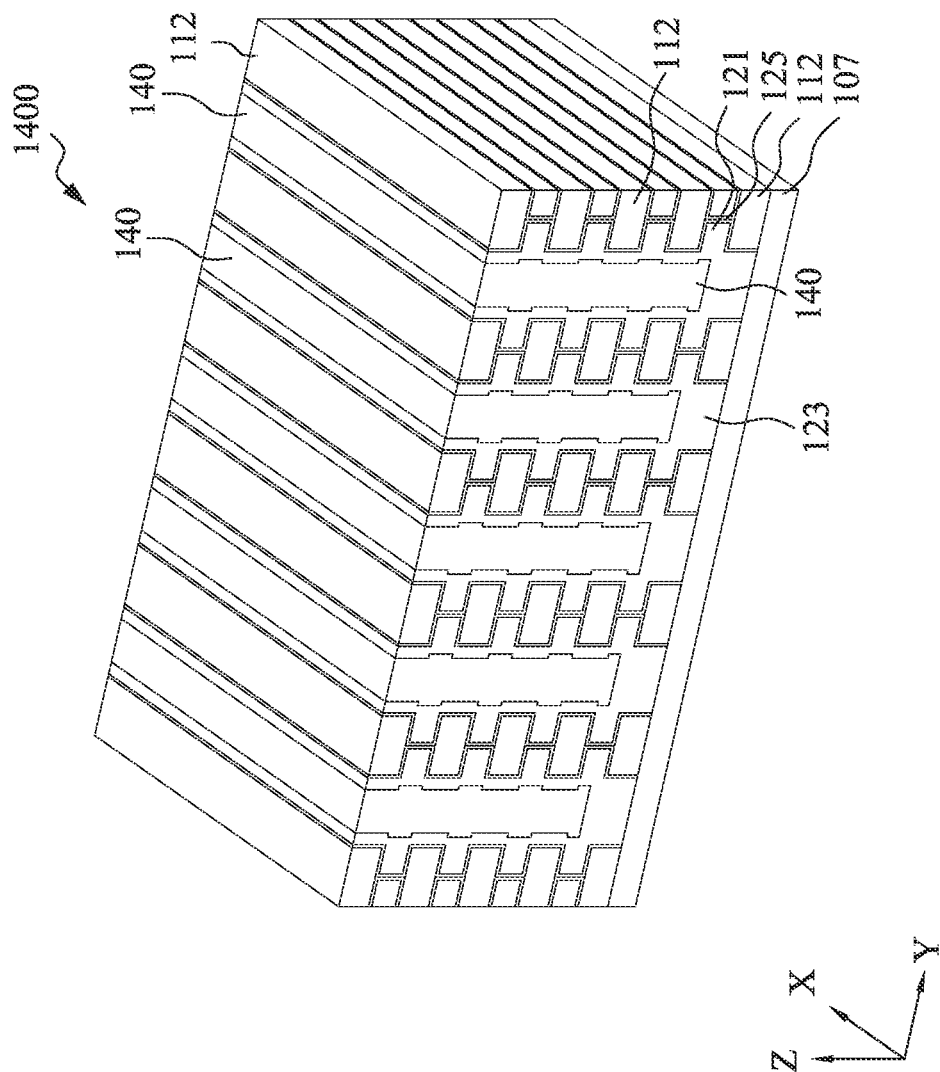

At operation 1316, operations 1306-1314 are repeated to form a second set of gate layer structures between the first set of gate layer structures formed during operations 1306-1314, after completely removing the sacrificial layers 111. Corresponding to operation 1316, FIG. 20 is a top, perspective view of the semiconductor die 1400 after formation of the second gate layer structures 121 parallel to the first gate layer structures 121 such that the sacrificial layers 111 are completely removed. The remaining portions of the sacrificial layers 111 may be removed by etching exposed portions of the sacrificial layers 111 in another set of first trenches formed between the previously formed first trenches. This leaves cavities between adjacent layers of insulating layers 112, and adjacent to the gate layer structure 121. Adhesive layer 125 is deposited on walls of the newly formed cavities, as described with respect to operation 1310. Next, the gate layer material is deposited in the cavities so as to form another set of gate layer structures 121 in the new set of first trenches, as described with respect to operation 1312, such that the two gate layer structures 121 abut each other with the adhesive layer 125 disposed therebetween (e.g., as shown in the cross-section view of FIG. 21). A CMP operation may be performed after filling the second set of first trenches with the insulating material 140 to planarize the top surface of the semiconductor die 1400.

Figure 21:
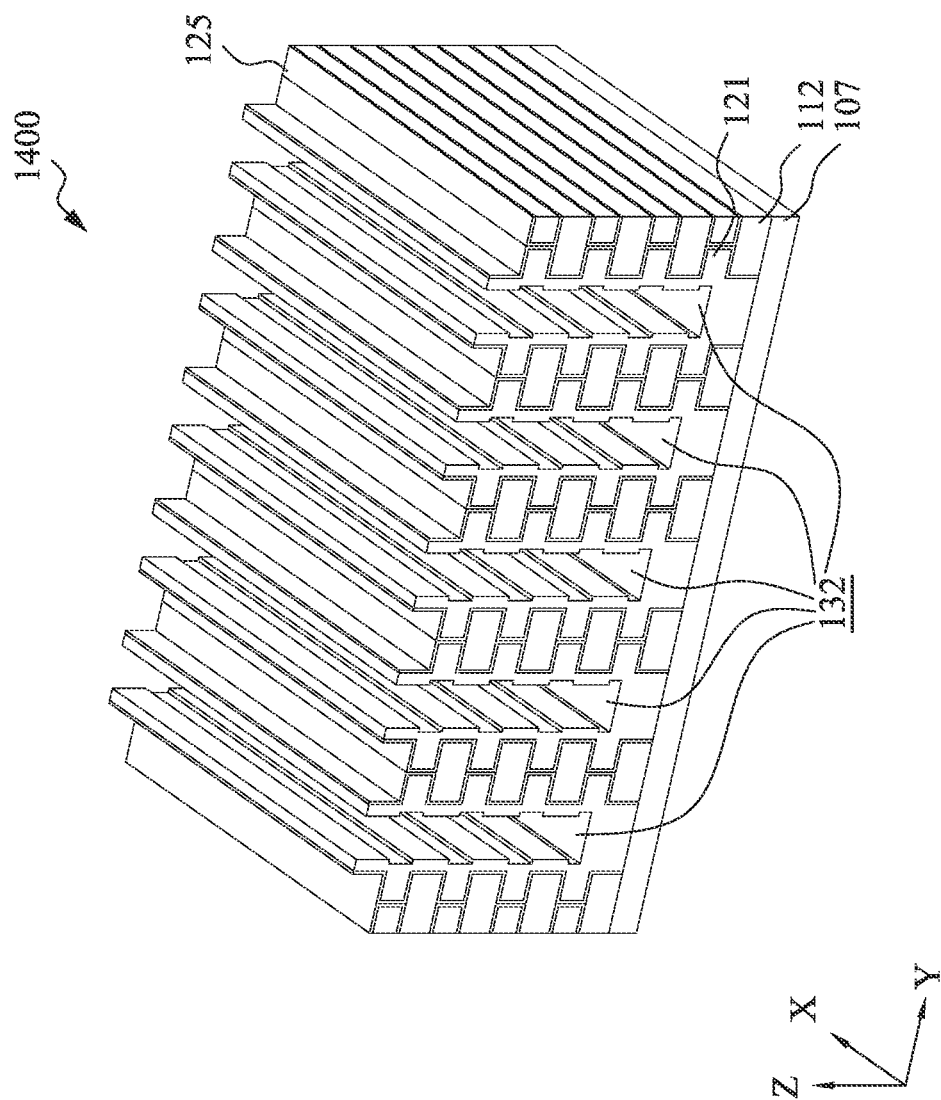

At operation 1318, exposed portions of the insulating material are removed to form second trenches bounded by each of the gate layer structures. Etching the insulating material also etches the topmost insulating layer that is also exposed. Corresponding to operation 1318, FIG. 21 is a top, perspective view of the semiconductor die 1400 after etching the insulating material 140 to form second trenches 132 extending in the first direction (e.g., the X-direction), as well as the topmost exposed insulating layer 112. In some embodiments, insulating material 140 and the topmost insulating layer 112 (which may also be formed from the same material as the insulating material 140) may be etched using an isotropic etch (e.g., a wet etch such as an HF or BHF etch) that has high selectivity for the insulating material 140. In other embodiments, the insulating material 140 and the topmost insulating layer 112 may be etched using a dry etch, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 132. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process.

Figure 22:
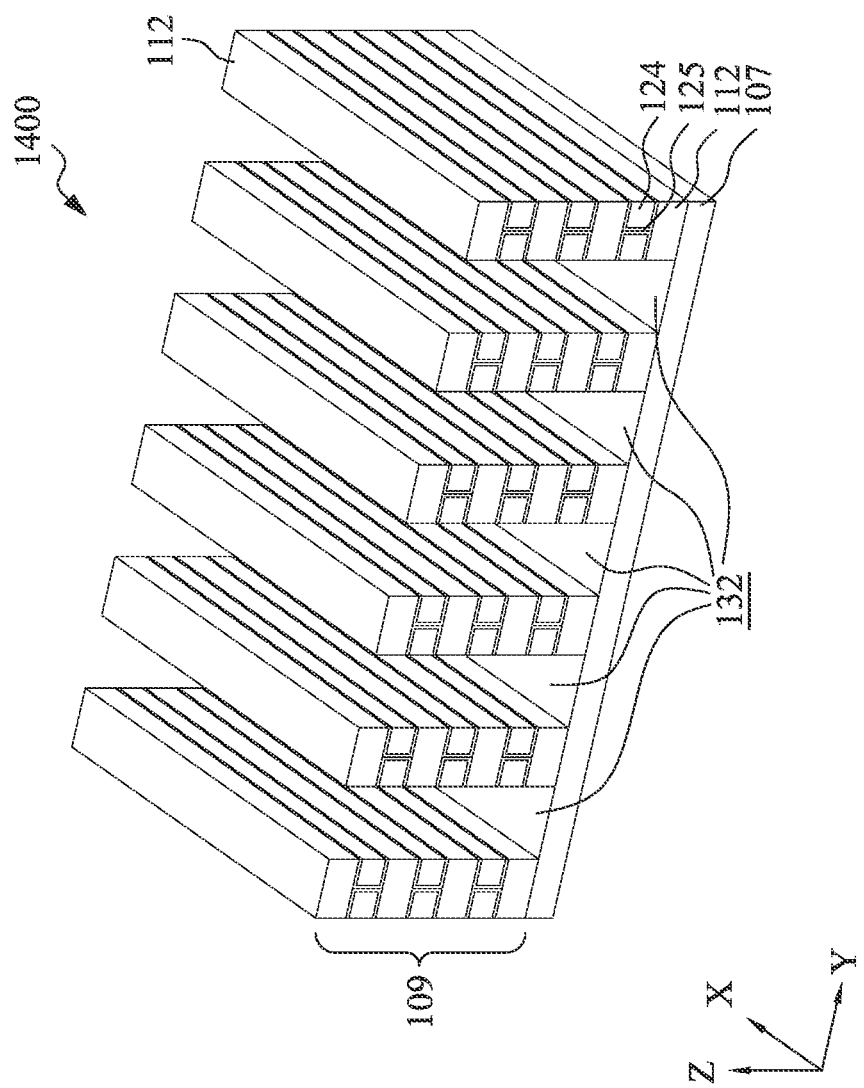

At operation 1320, a plurality of gate layers are formed, for example, by etching portions of the gate layer structure disposed on the top surface of the semiconductor die, portions disposed on radially inner surfaces of the insulating layers facing the trenches, portions disposed vertically between adjacent insulating layers that extend beyond a radial edge of the insulating layers, and portion disposed on top of the substrate. Corresponding to operation 1320, FIG. 22 is a top, perspective view of the semiconductor die 1400, after forming the plurality of gate layers 124 disposed between insulating layers 112. For example, the exposed portions of the gate layer structure 121 that remains disposed on the top surface of the semiconductor die 1400 after removal of the topmost insulating layer 112, portions disposed on radially inner surfaces of the insulating layers 112 facing the trenches 132, portions disposed vertically between adjacent insulating layers 112 that extend beyond a radial edge of the insulating layers 112, and portions disposed on top of the substrate 107 are etched. This divides gate layer structure 121 into a plurality of gate layers 124, such that a set of stacks 109 remain disposed on the substrate 107 separated by second trenches 132 extending in the Y-direction. The second trenches 132 extend from a top surface of the semiconductor die 1400 to the substrate 107 in the vertical or Z-direction. Each stack includes a plurality of insulating layers 112 and gate layers 124 (and optionally, the adhesive layers 125) alternatively disposed on top of each other. Moreover, forming the gate layers 124 also results in an insulating layer 112 that was below the previous topmost insulating layer 112 at operation 1318, becoming the topmost insulating layer 112 at operation 1320, as shown in FIG. 22. Partially etching the gate layer structure 121 causes the radial outer edges of the gate layers 124 to be aligned with corresponding radial outer edges of the insulating layers 112 in the Y-direction.

In some embodiments, the gate layer structure 121 may be etched using a dry etch, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 132. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. The etch may have substantial selectivity towards gate material relative to the material of the insulating layer 112.

At operation 1322, a memory layer is formed in each of the plurality of second trenches on exposed radial surfaces of the insulating layers and the gate layers located in the second trenches, such that the memory layer extends in the first direction (e.g., the X-direction), and from the top surface of the semiconductor die 1400 to the substrate 107. At operation 1324, a channel layer structure is formed within each of the plurality of second trenches on exposed radial surfaces of the memory layer such that the channel layer structure also extends in the first direction. At operation 1326, a gate extension layer is formed on exposed radial surface of the memory layer such that the gate extension layer also extends in the first direction. At operation 1328, the plurality of second trenches are filled with an insulating material to form an isolation layer extending in the first direction.

Figure 23:
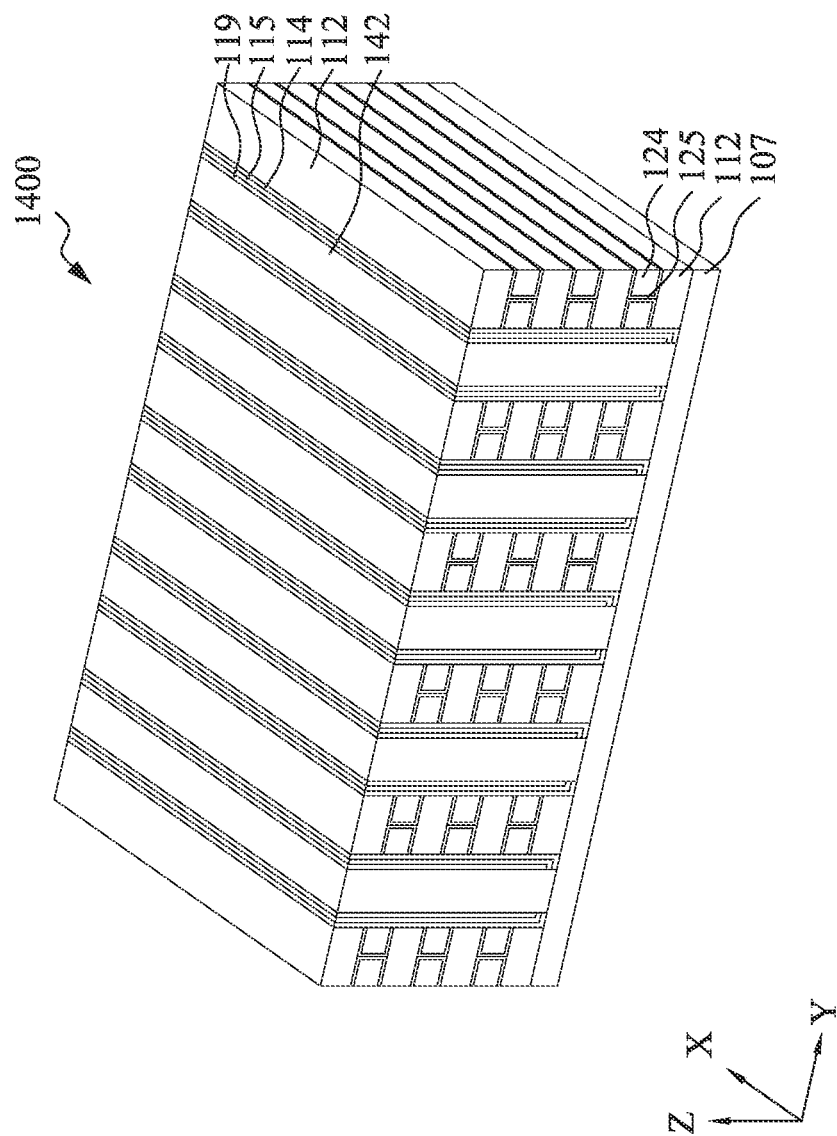

Corresponding to operations 1322-1328, FIG. 23 is a top, perspective view of the semiconductor die 1400 after formation of the memory layer 114, a channel layer structure 115, a gate extension layer 119, and an isolation layer 142 disposed between adjacent gate extension layers 119. The memory layer 114 may include a ferroelectric material, for example, lead zirconate titanate (PZT), $PbZr/TiO_3$, $BaTiO_3$, $PbTiO_2$, $HfO_2$, $Hr1-xZ_{rx}O_2$, $ZrO_2$, $TiO_2$, NiO, $TaO_x$, $Cu_2O$, $Nb_2O_5$, $AlO_x$, etc. The memory layer 114 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layer 114 is continuous on the walls of the second trenches 132.

The channel layer structure 115 is formed on a radially inner surface of the memory layer 114 in the Y-direction. In some embodiments, the channel layer structure 115 may be formed from a semiconductor material, for example, Si (e.g., polysilicon or amorphous silicon that may be n-type or p-type), Ge, SiGe, silicon carbide (SiC), IGZO, ITO, IZO, ZnO, IWO, etc. The channel layer structure 115 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the channel layer structure 115 is continuous on the radially inner surface of the memory layer 114.

The gate extension layer 119 is formed on a radially inner surface of the channel layer structure 115 in the Y-direction. The gate extension layer 119 may include may be formed from a dielectric material, for example, SiN, $HfO_2$, $TaO_x$, $TiO_x$, $AlO_x$, etc. The gate extension layer 119 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the gate extension layer 119 is continuous on the radially inner surface of the channel layer structure 115.

Each of the second trenches 132 are then filled with an insulating material (e.g., SiO, SiN, SiON, SiCN, SiC, SiOC, SiOCN, the like, or combinations thereof) so as to form the isolation layer 142. In some embodiments, the isolation layer 142 may be formed from the same material as the plurality of insulating layers 112 (e.g., $SiO_2$, SiN, SiON, SiCN, $HfO_2$, $TaO_x$, TiOx, $AlO_x$, etc.). The isolation layer 142 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of rows that include the memory layer 114, the channel layer structure 115, the gate extension layer 119, and the isolation layer 142 are formed in the semiconductor die 1400, and extend in the X-direction. A CMP operation may be performed after forming the isolation layer 142 to planarize the top surface of the semiconductor die 1400.

Figure 24B:
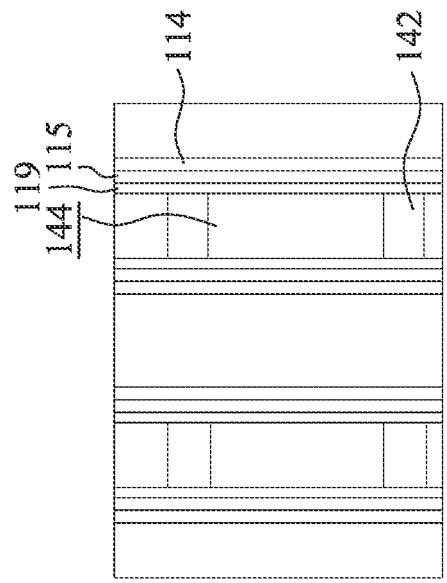
Figure 24A:
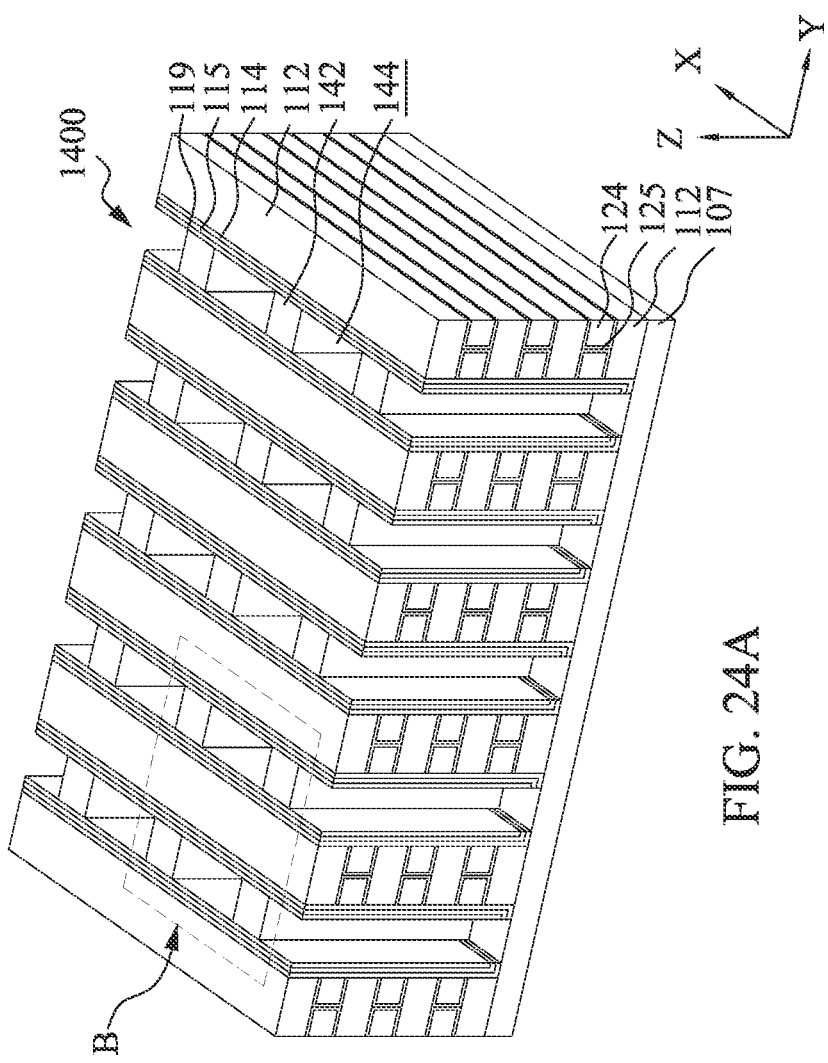

At operation 1330, a plurality of first cavities are formed through insulating layer. Corresponding to operation 1330, FIG. 24A is a top, perspective view of the semiconductor die 1400 after forming the first cavities 144, and FIG. 24B is a top view of a portion of the semiconductor die 1400 indicated by the arrow B in FIG. 24A. A plurality of first cavities 144 are formed through the isolation layer 142 from a top surface of the semiconductor die 1400 to a top surface of the substrate 107 in the Z-direction. The plurality of first cavities 144 may be formed using the same process used to form the first plurality of trenches 128. For example, the first cavities 144 may be formed, for example, by depositing a photoresist or other masking layer on a top surface of the semiconductor die 1400, and a pattern corresponding to the first cavities 144 defined in the masking layer (e.g., via photolithography, e-beam lithography, or any other suitable lithographic process). In other embodiments, a hard mask may be used. Subsequently, the isolation layer 142 may be etched using a plasma etching process (including radical plasma etching, remote plasma etching, and other suitable plasma etching processes, ME, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first cavities 144. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 25B:
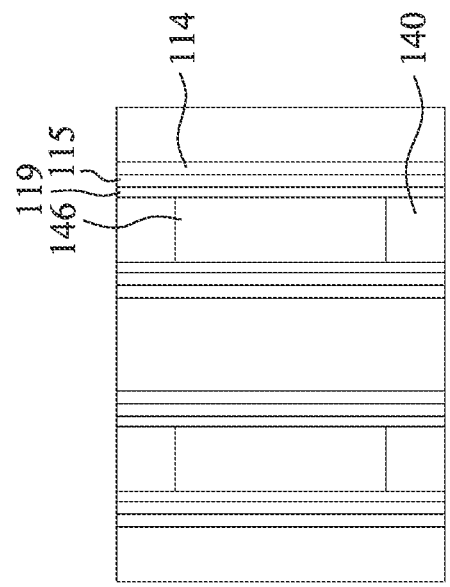
Figure 25A:
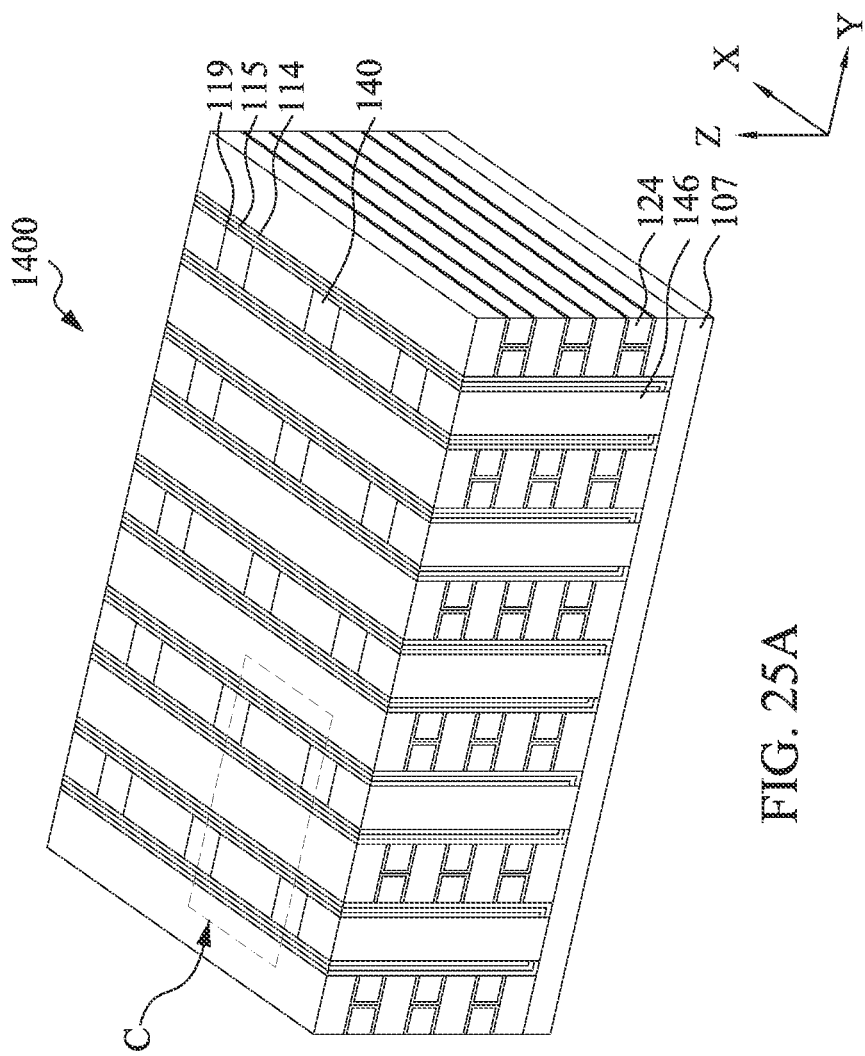

At operation 1332, a first sacrificial material is deposited in the first cavities. Corresponding to operation 1332, FIG. 25A is top, perspective view of the semiconductor die 1400, and FIG. 25B is a top of view of a portion of the semiconductor die 1400 indicated by the arrow C in FIG. 25A, after depositing a first sacrificial material 146 in the first cavities 144. The first sacrificial material 146 may be deposited using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. The first sacrificial material 146 may include, for example, SiN, $HfO_2$, $TaO_x$, $TiO_x$, $AlO_x$, or any other material, and in some embodiments, may include the same material from which the sacrificial layers 111 were formed. In various embodiments, the first sacrificial material 146 has a high etch selectivity relative to the material of the isolation layer 142 and the insulating layers 112. A CMP process may be performed after depositing the first sacrificial material 146 by planarizing a top surface of the semiconductor die 1400.

Figure 26B:
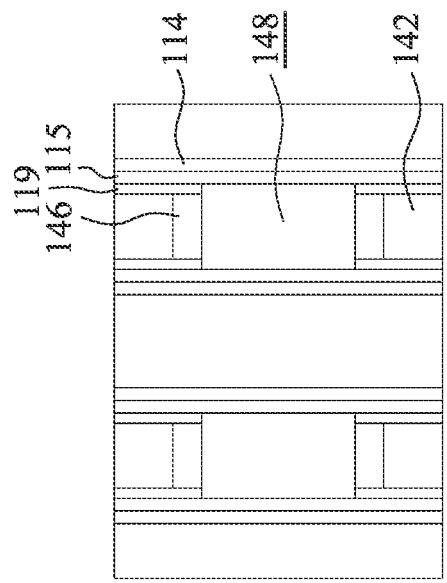
Figure 26A:
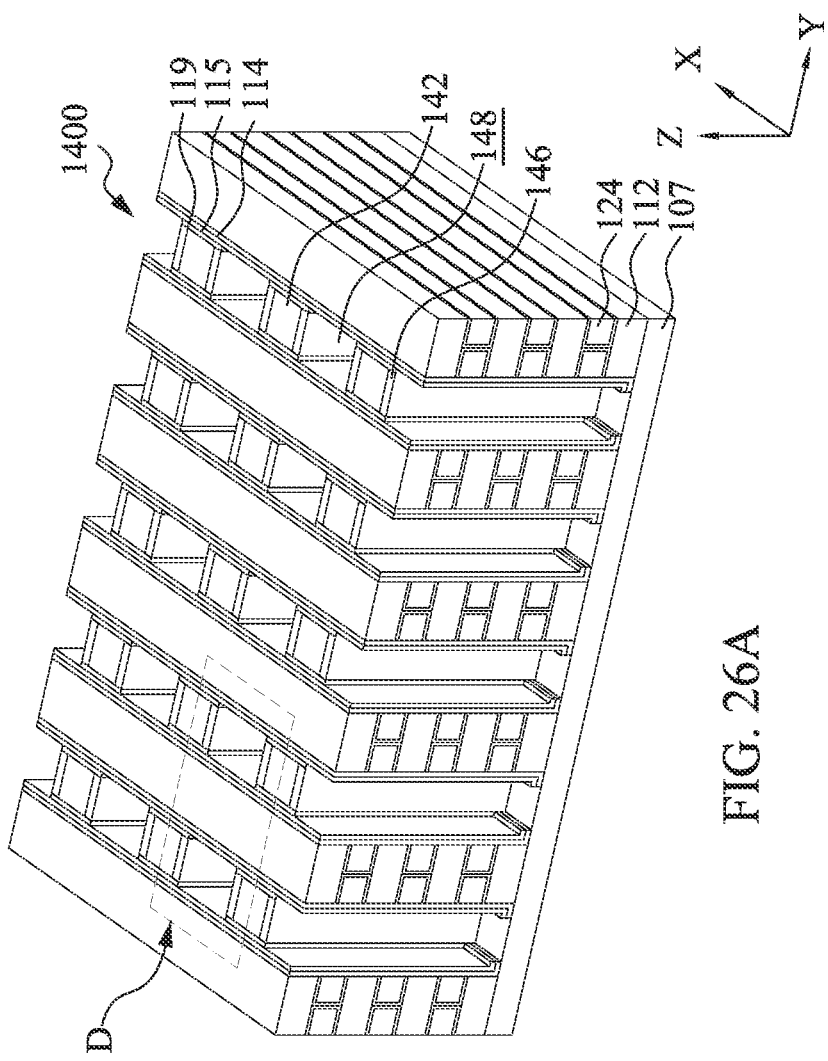

At operation 1334, portions of the first sacrificial material and the gate extension structure are etched to form second cavities. Corresponding to operation 1334, FIG. 26A is top, perspective view of the semiconductor die 1400, and FIG. 26B is a top of view of a portion of the semiconductor die 1400 indicated by the arrow D in FIG. 26A, after etching portions of the first sacrificial material 146 as well as the gate extensions layers 119 from a top surface of the semiconductor die 1400 to a top surface of the substrate 107 to form second cavities 148 through the first sacrificial material 146. The second cavities 148 may be formed using the same process used to form the plurality of first cavities 144. For example, the second cavities 148 may be formed, for example, by depositing a photoresist or other masking layer on a top surface of the semiconductor die 1400, and a pattern corresponding to the second cavities 148 defined in the masking layer (e.g., via photolithography, e-beam lithography, or any other suitable lithographic process). In other embodiments, a hard mask may be used. Subsequently, the first sacrificial material 146 may be etched using a plasma etching process (including radical plasma etching, remote plasma etching, and other suitable plasma etching processes, ME, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second cavities 148. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 27B:
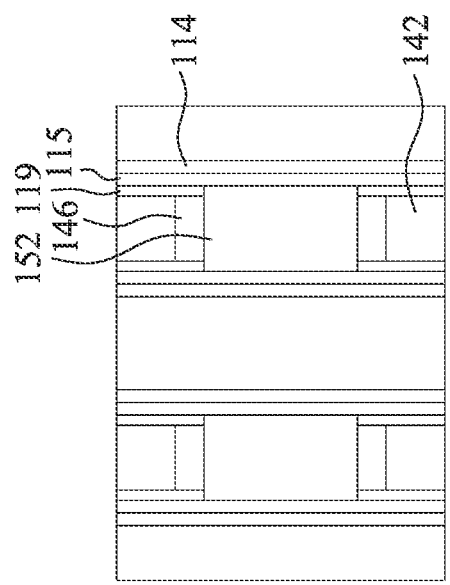
Figure 27A:
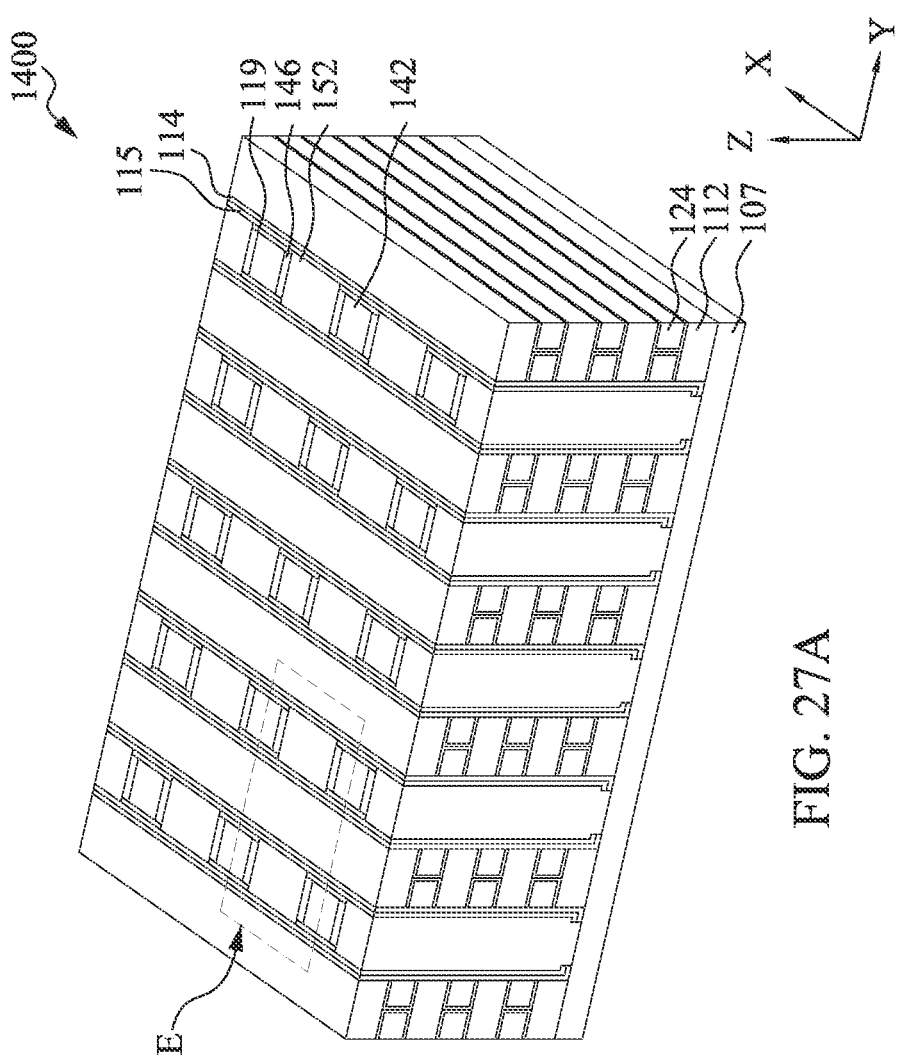

At operation 1336, a second sacrificial material is deposited in the second cavities. Corresponding to operation 1336, FIG. 27A is top, perspective view of the semiconductor die 1400, and FIG. 27B is a top of view of a portion of the semiconductor die 1400 indicated by the arrow E in FIG. 27A after filling the second cavities 148 with the second sacrificial material 152. The second sacrificial material 152 is bounded by the channel layer structure 115 in the Y-direction, and by the first sacrificial material 146 and the gate extension layer 119 in the X-direction. In some embodiments, the second sacrificial material 152 may include the same material as the first sacrificial material 146, for example, SiN, $HfO_2$, $TaO_x$, $TiO_x$, $AlO_x$, or any other material, and in some embodiments, may include the same material from which the sacrificial layers 111 were formed. The second sacrificial material 152 may be deposited using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. A CMP operation may be performed after depositing the second sacrificial material to planarize the top surface of the semiconductor die 1400.

Figure 28B:
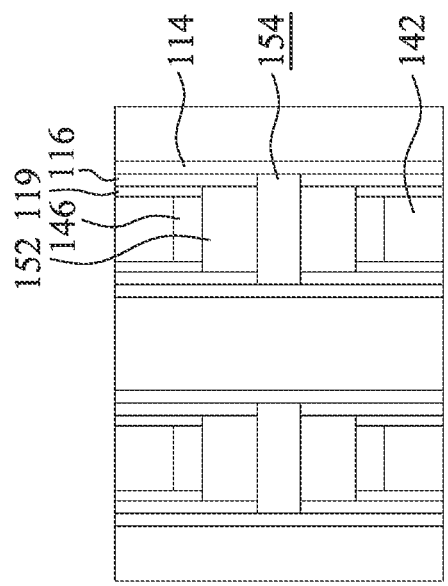
Figure 28A:
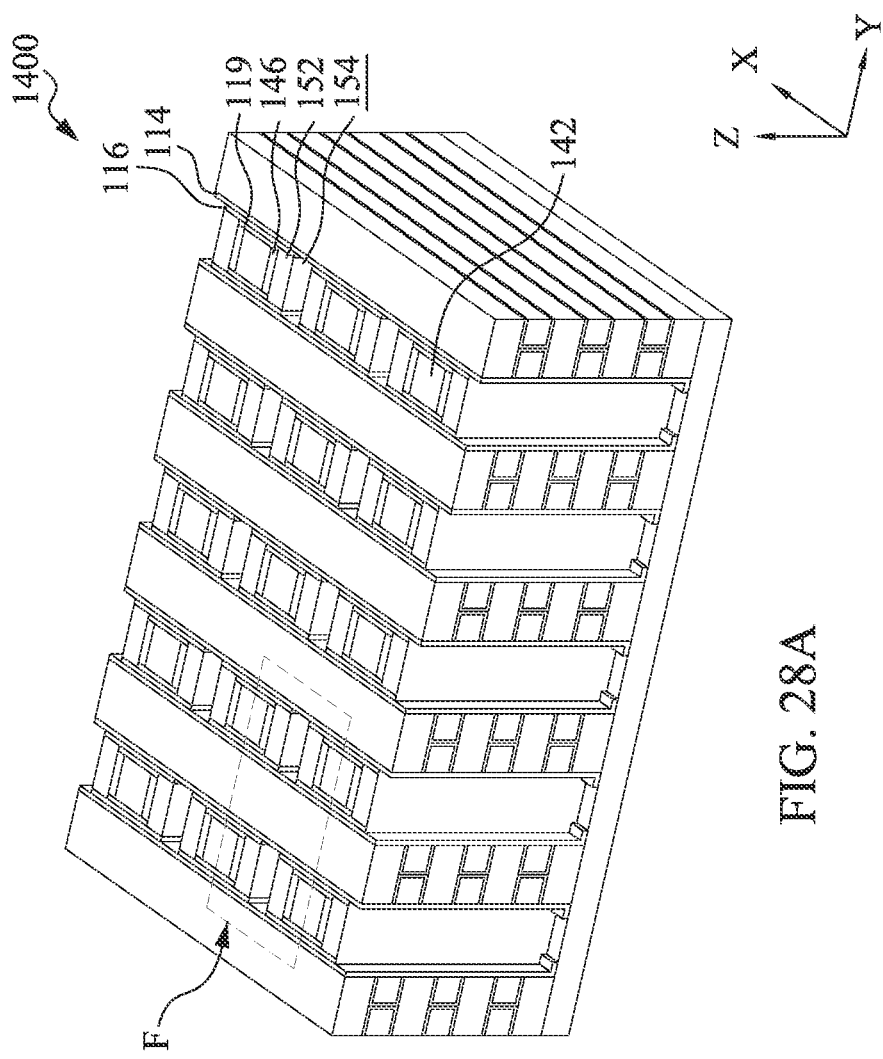

At operation 1338, portions of the second sacrificial material and the channel layer structure are etched to form second cavities through the second sacrificial material, and the channel layer. Corresponding to operation 1338, FIG. 28A is top, perspective view of the semiconductor die 1400, and FIG. 28B is a top of view of a portion of the semiconductor die 1400 indicated by the arrow F in FIG. 28A, after etching portions of the second sacrificial material 152 as well as the channel layer structure 115 from a top surface of the semiconductor die 1400 to a top surface of the substrate 107 to form third cavities 154 through the second sacrificial material 152. Portions of the channel layer structures 115 are also etched to form channel layers 116 included in each of the semiconductor devices 110 that are eventually formed in the semiconductor die 1400. The third cavities 154 may be formed using the same process used to form the plurality of first cavities 144. For example, the third cavities 154 may be formed, for example, by depositing a photoresist or other masking layer on a top surface of the semiconductor die 1400, and a pattern corresponding to the third cavities 154 defined in the masking layer (e.g., via photolithography, e-beam lithography, or any other suitable lithographic process). In other embodiments, a hard mask may be used. Subsequently, the portions of the second sacrificial material 152 as well as portions of the channel layer structure 115 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the third cavities 154. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 29B:
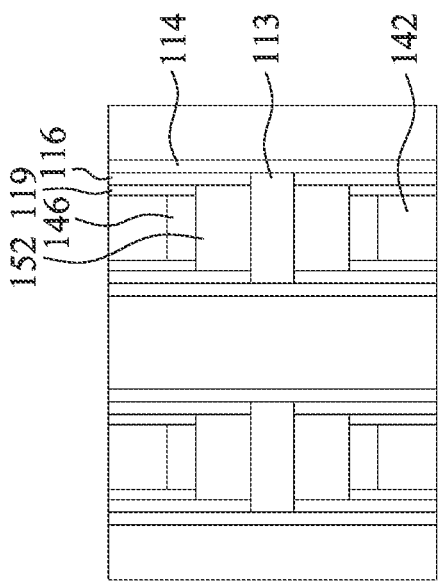
Figure 29A:
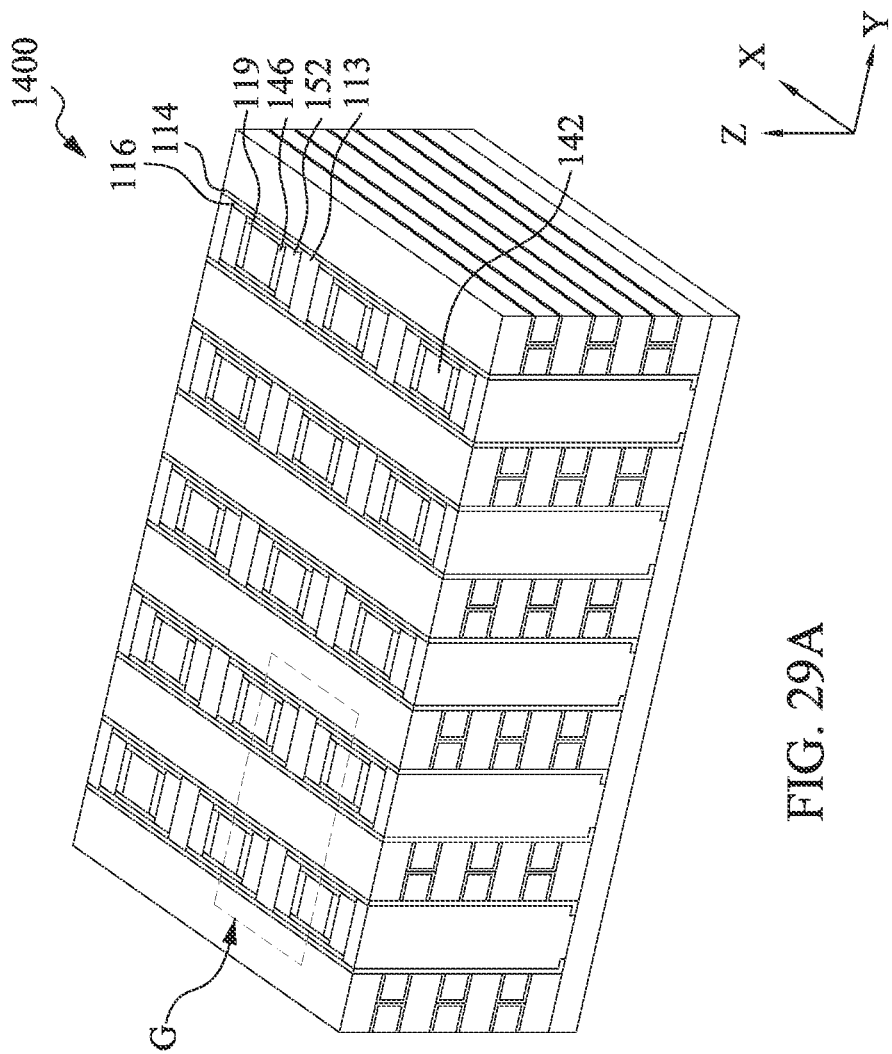

At 1340, device spacers are formed. Corresponding to operation 1340, FIG. 29A is top, perspective view of the semiconductor die 1400, and FIG. 29B is a top of view of a portion of the semiconductor die 1400 indicated by the arrow G in FIG. 29A after forming the device spacers 113. The device spacers 113 are formed by filling the plurality of third cavities 154 with an insulation material (e.g., $SiO_2$, SiN, SiON, SiCN, $HfO_2$, $TaO_x$, $TiO_x$, $AlO_x$, etc.). In some embodiments, device spacers 113 may be formed using the same material as the insulating layers 112 and/or the isolation layer 142. The device spacers 113 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of rows that include the memory layer 114, the channel layer 116, the gate extension layers 119, and the isolation layer 142 are formed in the semiconductor die 1400 extending in the X-direction, and having device spacers 113 disposed at regular intervals separating adjacent semiconductor devices 110 that will be form in subsequent steps in the semiconductor die 1400. A CMP operation may be performed after forming the isolation layer 142 to planarize the top surface of the semiconductor die 1400.

Figure 30B:
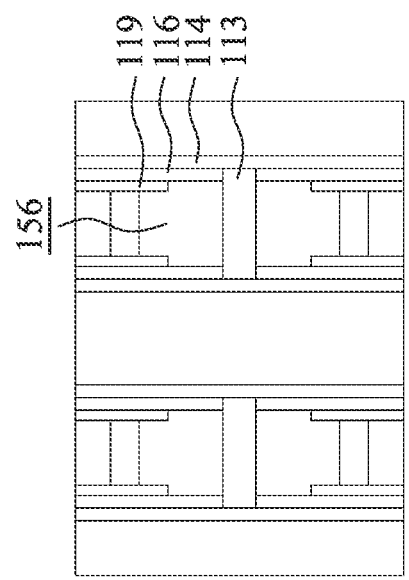
Figure 30A:
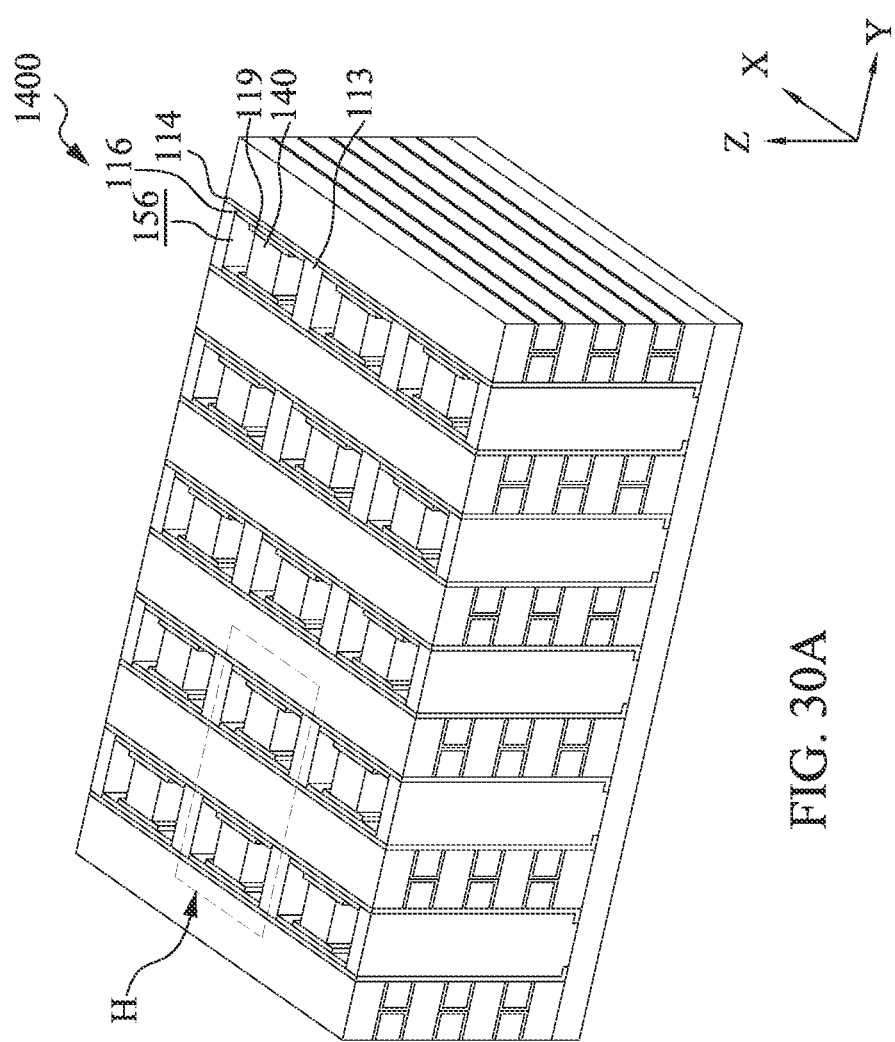

At operation 1342, the first sacrificial material and the second sacrificial material are removed to form fourth cavities. Corresponding to operation 1340, FIG. 30A is top, perspective view of the semiconductor die 1400, and FIG. 30B is a top of view of a portion of the semiconductor die 1400 indicated by the arrow H in FIG. 30A, after removing the first sacrificial material 146 and the second sacrificial material 152 to form fourth cavities 156. The sacrificial material may be removed by etching the first and second sacrificial materials 146 and 152 via an isotropic etch wet etch (e.g., a hydrofluoric etch, a buffered hydrofluoric etch, a phosphoric acid etch, etc.). In other embodiments, the first and second sacrificial materials 146 and 152 are removed by etching via a dry etch process, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the fourth cavities 156. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 31B:
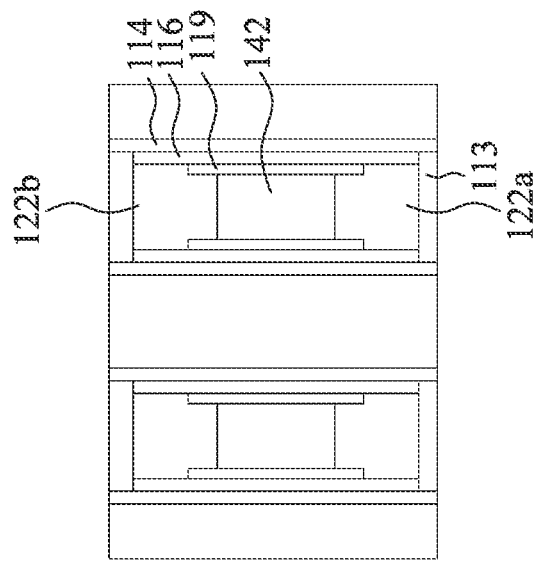
Figure 31A:
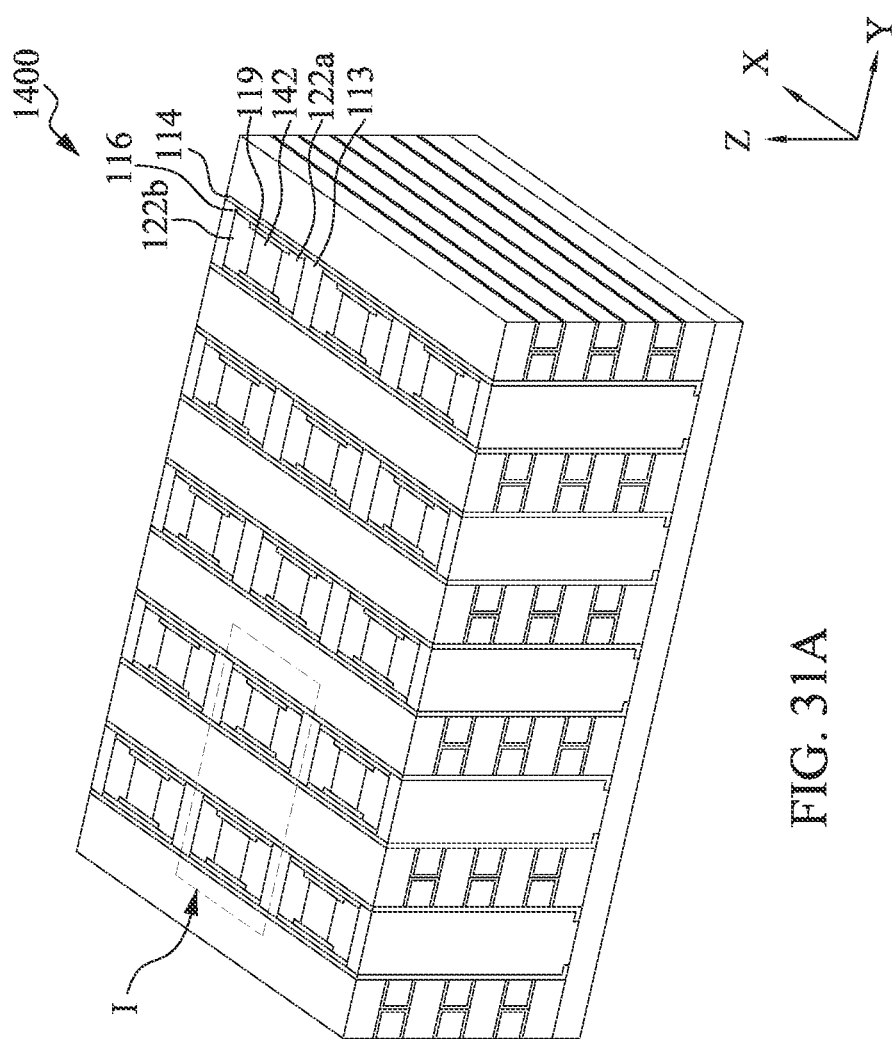

At operation 1344, drains are formed by filling the fourth cavities with the drain material. Corresponding to operation 1344, FIG. 31A is a top, perspective view of the semiconductor die 1400, and FIG. 31B is a top view of a portion of the semiconductor die 1400 indicated by the arrow I in FIG. 31A, after forming the drains 122a/b. The drains 122a/b may be formed by depositing the drain material in the fourth cavities 156 using an epitaxial growth process, physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. In-situ doping (ISD) may be applied to form doped drains 122a/b, thereby creating the junctions for each semiconductor device 110. The drains 122a/b are located at opposite axial ends of the isolation layer 142. Portions of radially outer surface of the drains 122a/b are in contact with corresponding portions of a radially inner surface of the channel layer 116 and the gate extension layer 119. A CMP operation may be performed after forming the drains 122a/b to planarize the top surface of the semiconductor die 1400.

Figure 32B:
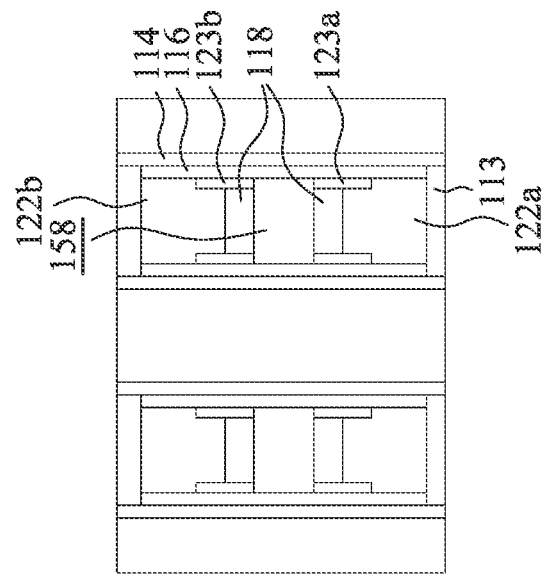
Figure 32A:
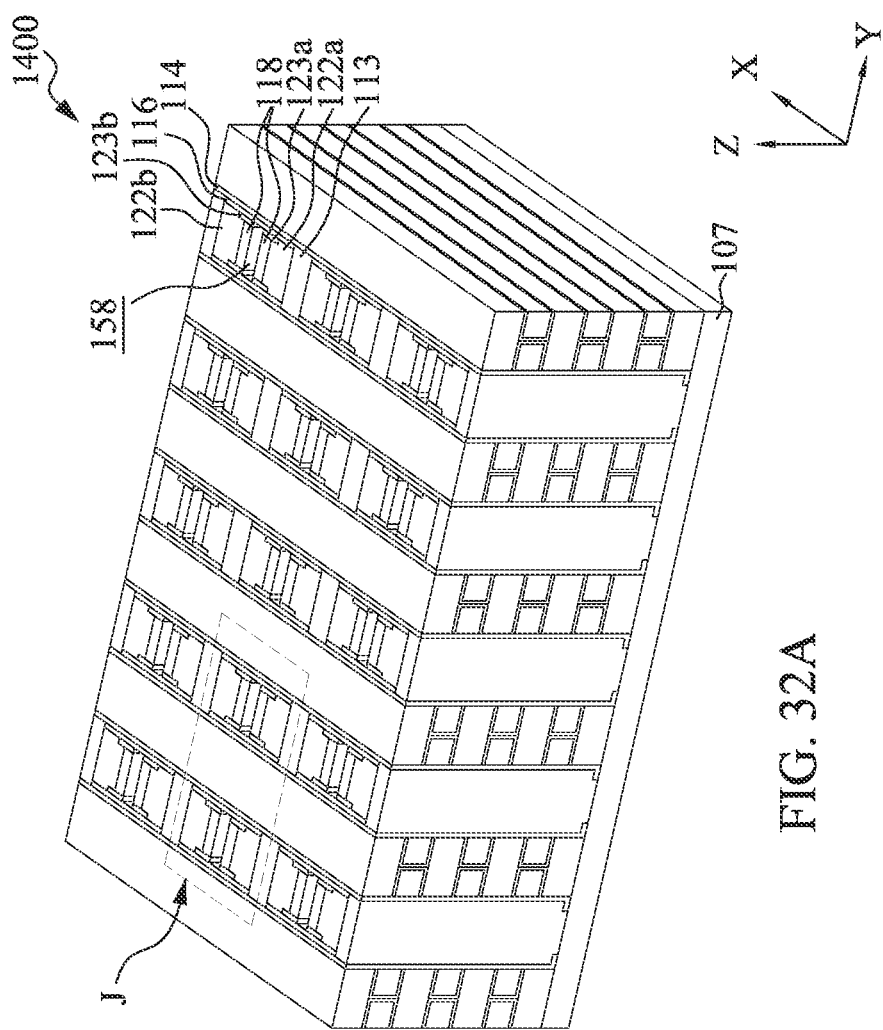

At operation 1346, the gate extension structures are formed. Corresponding to operation 1346, FIG. 32A is top, perspective view of the semiconductor die 1400, and FIG. 32B is a top of view of a portion of the semiconductor die 1400 indicated by the arrow J in FIG. 32A, after forming the gate extension structures 123a/b. To form the gate extension structures, a fifth cavity 158 is formed in the isolation layer 142 disposed between the drains 122a/b at a location where the source 120 is to be formed, and by also etching a portion of the gate extension layer 119. This results in formation of the gate extension structures 123a/b that are in contact with the respective drains 122a/b and extends to the edge of the fifth cavities 158. The fifth cavities 158 extend from a top surface of the semiconductor die 1400 to a top surface of the substrate 107. Moreover, the remaining portion of the isolation layer 142 forms the inner spacers 118.

The fifth cavities 158 may be formed via a dry etch process, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the fifth cavities 158. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 33B:
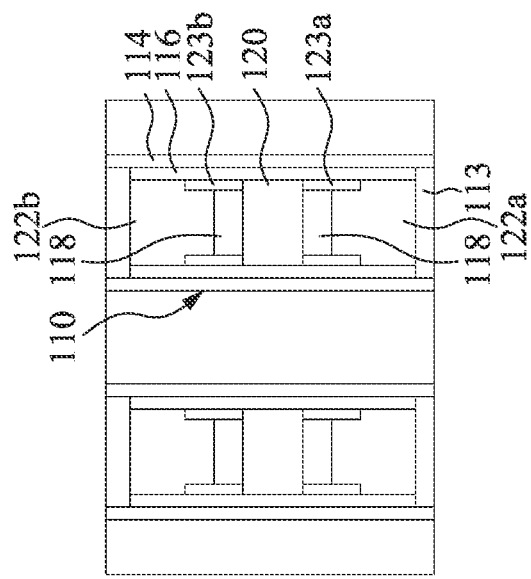
Figure 33A:
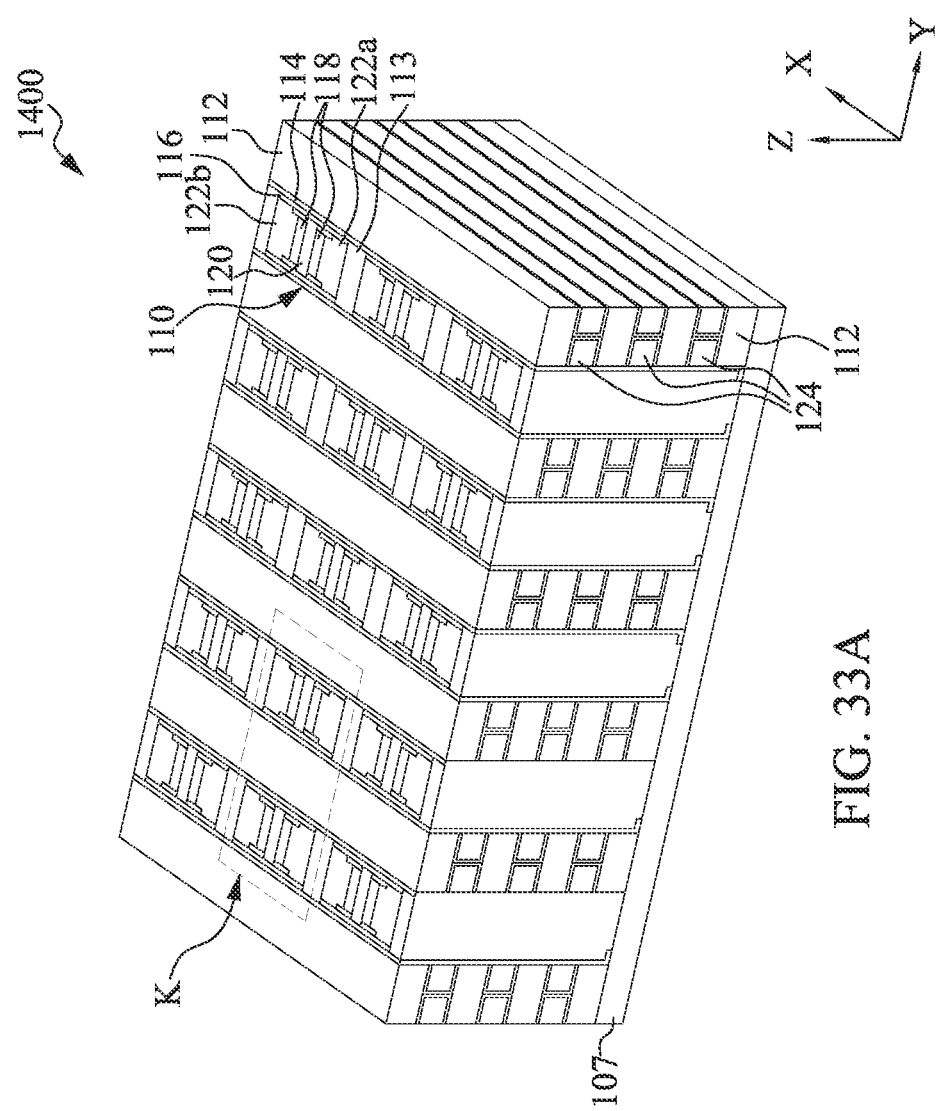

At operation 1348, the source is formed thereby resulting in formation of an array of semiconductor devices. Corresponding to operation 1348, FIG. 33A is a top, perspective view of the semiconductor die 1400, and FIG. 33B is a top view of a portion of the semiconductor die 1400 indicated by the arrow K in FIG. 33A, after forming the source 120. The source 120 may be formed by depositing the source material in the fifth cavities 158 using an epitaxial growth process, physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. In-situ doping (ISD) may be applied to form doped source 120. In various embodiments, N-type and p-type FETs are formed by implanting different types of dopants to selected regions (e.g., the source 120 or the drains 122*a/b*) to form the junction(s). N-type devices can be formed by implanting arsenic (As) or phosphorous (P), and p-type devices can be formed by implanting boron (B). The pair of drains 122*a/b* are located on either side of the source 120 in the X-direction, and separated therefrom by the inner spacers 118. Moreover, an axial end of each of the gate extension structures 123*a/b* extend into a corresponding drain 122*a/b* and an opposite axial end of the gate extension structures 123*a/b* extends towards and may be in contact with an outer axial edge of the source 120.

In some embodiments, a semiconductor device comprises a source, and a pair of drains disposed on either side of the source in a first direction and spaced apart from the source. A channel layer is disposed on at least one radially outer surface of the source and the pair of drains in a second direction perpendicular to the first direction, the channel layer extending in the first direction. A memory layer is disposed on a radially outer surface of the channel layer in the second direction and extending in the first direction. At least one gate layer is disposed on a radially outer surface of the memory layer in the second direction and extending in the first direction. A gate extension structure extends from the each of the drains at least part way towards the source in the first direction, the gate extension structure located proximate to the channel layer and being in contact with each of the channel layer and the corresponding drain.

In some embodiments, a semiconductor die comprises an array of semiconductor devices, each row of the array of semiconductor devices extending in a first direction. Each semiconductor device comprises a source and a pair of drains disposed on either side of the source in a first direction and spaced apart from the source. A channel layer is disposed on at least one radially outer surface of the source and the pair of drains in a second direction perpendicular to the first direction, the channel layer extending in the first direction. A memory layer is disposed on a radially outer surface of the channel layer in the second direction and extends in the first direction. At least one gate layer is disposed on a radially outer surface of the memory layer in the second direction and extends in the first direction. Gate extension structures are in contact with the corresponding drain and the channel layer such at least a portion of a gate length of each semiconductor device is defined by each of the gate extension structures.

A method of making a semiconductor device comprises providing a stack comprising a plurality of insulating layers and a plurality of sacrificial layers alternatively stacked on top of each other, the stack extending in a first direction. A plurality of gate layers are formed by replacing the plurality of sacrificial layers. The method also includes forming a memory layer extending along the first direction radially inwards of and coupled to the plurality of gate layers in a second direction perpendicular to the first direction. The method also includes forming a channel layer extending along the first direction and coupled to a radially inner surface of the memory layer in the second direction. The method also includes forming gate extension structures extending along portions of the channel layer in the first direction, and coupled to a radially inner surface of the channel layer. A source and a pair of drains are formed disposed on either side of the source and spaced apart from the source in the first direction, a portion of a radially outer surface of at least the drains being in contact with a corresponding gate extension structure in the second direction.

As used herein, the terms "about" and "approximately" generally mean plus or minus 10% of the stated value. For example, about 0.5 would include 0.45 to 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a source;
    a pair of drains disposed on either side of the source in a first direction and spaced apart from the source;
    a channel layer disposed on at least one radially outer surface of the source and the pair of drains in a second direction perpendicular to the first direction, the channel layer extending in the first direction;
    a memory layer disposed on a radially outer surface of the channel layer in the second direction and extending in the first direction;
    at least one gate layer disposed on a radially outer surface of the memory layer in the second direction and extending in the first direction; and
    a gate extension structure extending from the each of the drains at least part way towards the source in the first direction, the gate extension structure located proximate to the channel layer and being in contact with each of the channel layer and a corresponding drain.

2. The semiconductor device of claim 1, wherein the semiconductor device comprises:
    a plurality of gate layers; and
    a stack disposed on a radially outer surface of the memory layer in the second direction, the stack comprising a plurality of insulating layers and the plurality of gate layers alternatively stacked on top each other.

3. The semiconductor device of claim 1, wherein a first axial end of the gate extension structure is disposed axially outwards of an axially inward edge of the corresponding drain that is proximate to the source in the first direction, and a second axial end of the gate extension structure opposite the first axial end is in contact with an axially outward edge of the source that is proximate to the corresponding drain in the first direction.

4. The semiconductor device of claim 3, wherein:
the corresponding drain is a first drain, the gate extension structure is a first gate extension structure, and
a second gate extension structure in contact with a second drain opposite the first drain, a first axial end of the second gate extension structure is in contact with an axially inward edge of the second drain, and a second axial end of the second gate extension structure is disposed radially inward of an axially outward edge the source that is proximate to the second drain in the first direction.

5. The semiconductor device of claim 1, wherein a first axial end of the gate extension structure is disposed axially outwards of an axially inward edge of the corresponding drain that is proximate to the source in the first direction, and a second axial end of the gate extension structure opposite the first axial end is axially aligned with the axially inward edge of the corresponding drain.

6. The semiconductor device of claim 1, wherein a first radial edge of the gate extension structure is located radially inwards of a radially outward edge of the corresponding drain in the second direction, and a second radial edge of the gate extension structure opposite the first radial edge is axially aligned with the radially outward edge of the corresponding drain in the second direction.

7. The semiconductor device of claim 1, wherein a first radial edge of the gate extension structure is axially aligned with a radially outward edge of a drain in the second direction, and a second radial edge of the gate extension structure opposite the first radial edge is located radially outward of the radially outward edge of the corresponding drain in the second direction.

8. The semiconductor device of claim 7, wherein the first radial edge of the gate extension structure is axially aligned with a corresponding radially inward edge of the channel layer in the second direction, and the second radial edge of the gate extension structure is disposed radially outward of the corresponding radially inward edge of the channel layer in the second direction.

9. The semiconductor device of claim 1, wherein the channel layer comprises a pair of channel layers, one of the pair of channel layers being disposed on first radially outer surfaces of the source and the drains, and the other of the pair of channel layers disposed on second radially outer surfaces of the source and drains opposite the first radially outer surfaces.

10. The semiconductor device of claim 1, wherein each of the pair of drains comprises two gate extension structures in contact with the respective drains proximate to opposite to radial edges of the respective drains in the second direction.

11. The semiconductor device of claim 1, wherein:
a single channel layer is disposed on first radially outer surfaces of the source and the drains in the second direction, and
an insulating layer is disposed on second radially inner surfaces of the source and drains that is opposite the first radially outer surfaces in the second direction.

12. A semiconductor die, comprising:
an array of semiconductor devices, each row of the array of semiconductor devices extending in a first direction, each semiconductor device comprising:
a source,
a pair of drains disposed on either side of the source in the first direction and spaced apart from the source,
a channel layer disposed on at least one radially outer surface of the source and the pair of drains in a second direction perpendicular to the first direction, the channel layer extending in the first direction,
a memory layer disposed on a radially outer surface of the channel layer in the second direction and extending in the first direction,
at least one gate layer disposed on a radially outer surface of the memory layer in the second direction and extending in the first direction, and
gate extension structures in contact with a corresponding drain and the channel layer such that at least a portion of a gate length of each semiconductor device is defined by each of the gate extension structures.

13. The semiconductor die of claim 12, wherein each semiconductor device disposed in a first row of the semiconductor die is parallel to and axially aligned in the first direction with another semiconductor device disposed in a second row that is parallel to the first row in the second direction.

14. The semiconductor die of claim 12, wherein each semiconductor device disposed in a first row of the semiconductor die is parallel to and axially offset in the first direction with another semiconductor device disposed in a second row that is parallel to the first row in the second direction.

15. The semiconductor die of claim 12, wherein a first radial edge of each of the gate extension structures is axially aligned with a radially outward edge of a drain in the second direction, and a second radial edge of each of the gate extension structures opposite the first radial edge is located radially outward of the radially outward edge of the corresponding drain in the second direction.

16. The semiconductor die of claim 15, wherein the first radial edge of each of the gate extension structures is axially aligned with a corresponding radially inward edge of the channel layer in the second direction, and the second radial edge of each of the gate extension structures is disposed radially outward of the corresponding radially inward edge of the channel layer in the second direction.

17. The semiconductor die of claim 12, wherein the channel layer comprises a pair of channel layers, one of the pair of channel layers being disposed on first radially outer surfaces of the source and the drains, and the other of the pair of channel layers disposed on second radially outer surfaces of the source and drains opposite the first radially outer surfaces.

18. The semiconductor die of claim 12, wherein each of the pair of drains comprises two gate extension structures in contact with the respective drains proximate to opposite radial edges of the respective drains in the second direction.

19. The semiconductor die of claim 12, wherein:
each row comprises a first semiconductor device and a second semiconductor device disposed parallel to the first semiconductor device in the second direction,
radially outer surfaces of the drains of first semiconductor device in the second direction being in contact with a first channel layer,
drains of the second semiconductor device being spaced part from the drains of the first semiconductor device, radially outer surfaces of the drains of the second semiconductor device in the second direction being in contact with a second channel layer opposite the first channel layer, and the source extends from the first channel layer to the second channel layer in the second direction such that the source is included in each of the first and second semiconductor devices.

20. A method of making a semiconductor device, comprising:
- providing a stack comprising a plurality of insulating layers and a plurality of sacrificial layers alternatively stacked on top of each other, the stack extending in a first direction;
- forming a plurality of gate layers by replacing the plurality of sacrificial layers;
- forming a memory layer extending along the first direction radially inwards of and coupled to the plurality of gate layers in a second direction perpendicular to the first direction;
- forming a channel layer extending along the first direction and coupled to a radially inner surface of the memory layer in the second direction;
- forming gate extension structures extending along portions of the channel layer in the first direction, and coupled to a radially inner surface of the channel layer; and
- forming a source and a pair of drains disposed on either side of the source and spaced apart from the source in the first direction, a portion of a radially outer surface of at least the drains being in contact with a corresponding gate extension structure in the second direction.

* * * * *